United States Patent
Fujieda et al.

(10) Patent No.: US 6,181,174 B1
(45) Date of Patent: Jan. 30, 2001

(54) SEMICONDUCTOR INTEGRATED CIRCUIT DEVICE

(75) Inventors: Waichirou Fujieda; Yasuharu Sato; Nobutaka Taniguchi; Hiroyoshi Tomita; Yasurou Matsuzaki, all of Kawasaki (JP)

(73) Assignee: Fujitsu Limited, Kawasaki (JP)

(*) Notice: Under 35 U.S.C. 154(b), the term of this patent shall be extended for 0 days.

(21) Appl. No.: 09/404,221

(22) Filed: Sep. 23, 1999

(30) Foreign Application Priority Data

Sep. 24, 1998 (JP) .................................................. 10-270053
Jun. 8, 1999 (JP) .................................................. 11-161331

(51) Int. Cl.[7] ....................................................... H03L 7/06
(52) U.S. Cl. ........................................... 327/158; 327/291
(58) Field of Search .................................... 327/156, 158, 327/165, 233, 291, 292, 293

(56) References Cited

U.S. PATENT DOCUMENTS 5,929,711 * 7/1999 Ito ........................................ 331/1 A
6,066,968 * 5/2000 Yang .................................... 327/156

* cited by examiner

*Primary Examiner*—Jeffrey Zweizig
(74) *Attorney, Agent, or Firm*—Arent Fox Kintner Plotkin & Kahn PLLC

(57) ABSTRACT

A semiconductor integrated circuit device includes a DLL circuit. The DLL circuit includes a frequency divider which frequency-divides an input clock at a frequency dividing ratio which is varied depending on a frequency of the input clock and thus results in a dummy clock and a reference clock. A delay system includes a variable delay circuit which delays the dummy clock. A control circuit controls a delay amount of the variable delay circuit so that a phase of a delayed dummy clock from the delay system and the reference clock becomes zero.

8 Claims, 34 Drawing Sheets

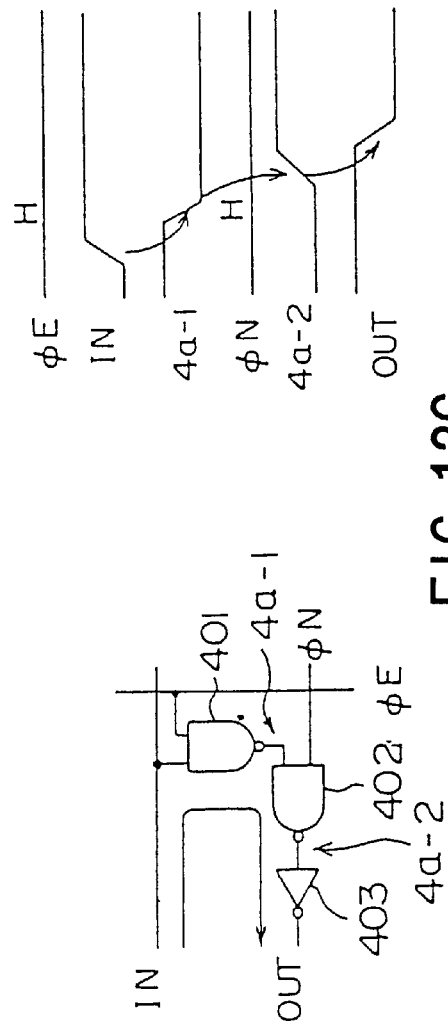
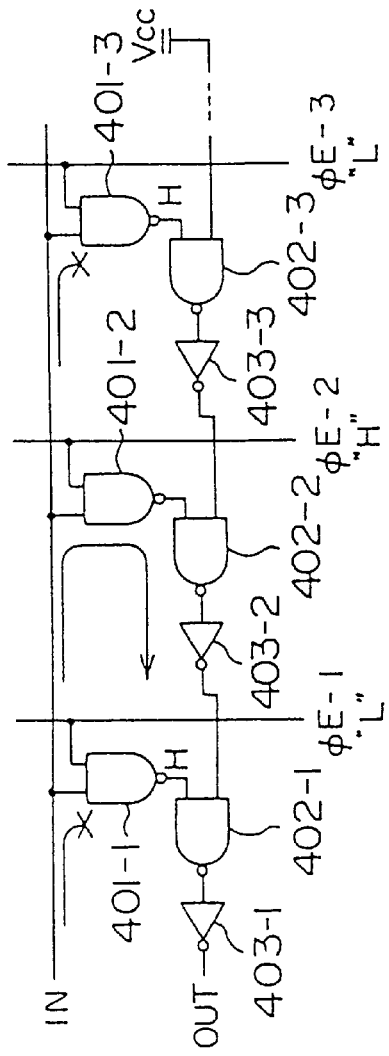
FIG. 13A
FIG. 13B
FIG. 13C

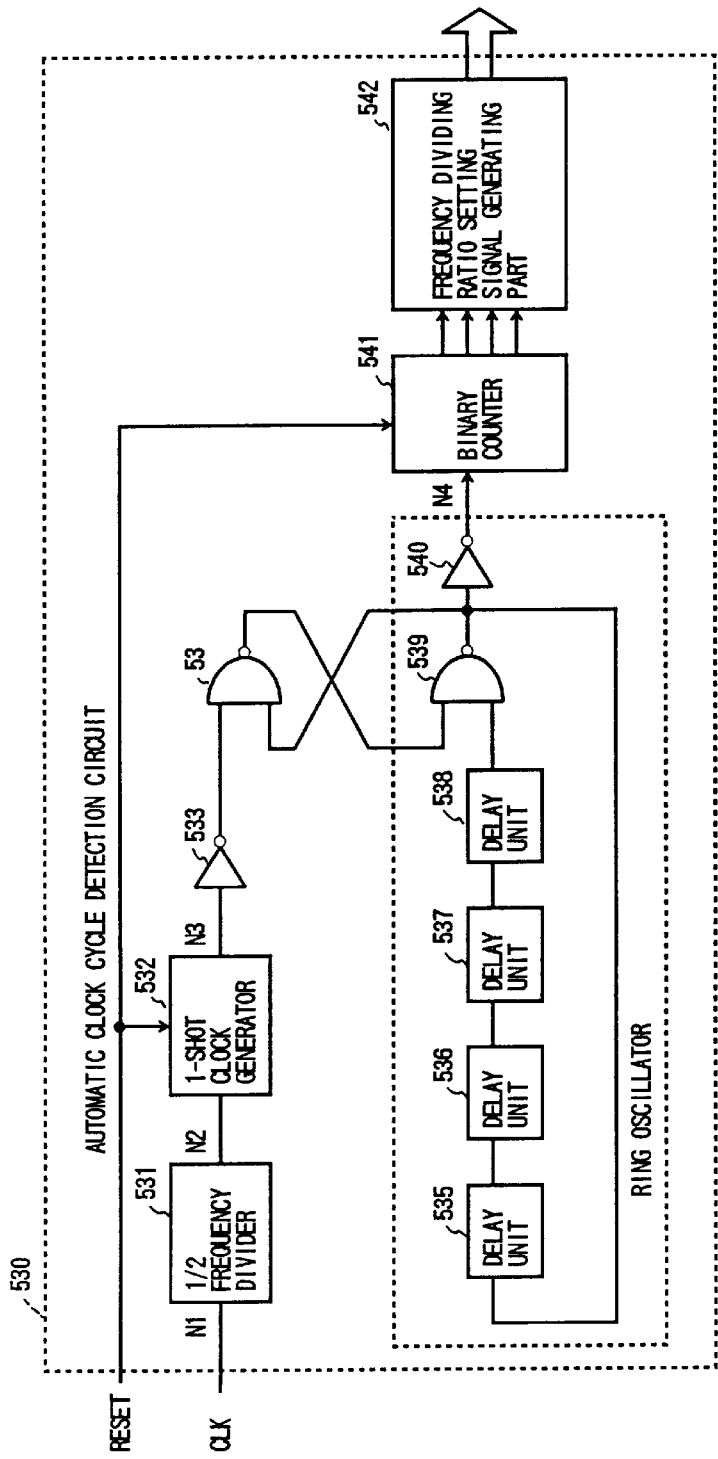
FIG. 28A
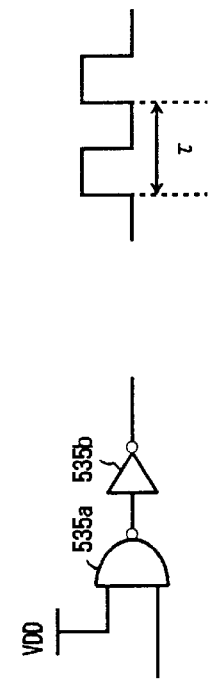
FIG. 28B
FIG. 28C

SEMICONDUCTOR INTEGRATED CIRCUIT DEVICE

BACKGROUND OF THE INVENTION

1. Field of the Invention

The present invention generally relates to semiconductor integrated circuit devices, and more particularly, to a semiconductor integrated circuit device equipped with a delayed locked loop (DLL).

Recently, semiconductor integrated circuit devices have been advanced to operate at a high speed and have a high integration density. Further, it has been required that a phase-synchronized clock signal is supplied to given circuits in the semiconductor integrated circuit devices. More particularly, a synchronous dynamic random access memory (SDRAM) is designed to be equipped with a DLL circuit, which supplies a signal synchronized in phase with an external clock signal to a plurality of output buffer circuits. The DLL circuit is required to have a higher precision in order to handle a higher frequency.

2. Description of the Related Art

FIG. 1 is a block diagram of a conventional DLL circuit. An external clock signal supplied to a clock input pad 150 from the outside of the circuit passes through an input circuit 152 and is supplied, as a real clock, to a delay circuit 154 and a frequency divider 156. The frequency divider 156 frequency-divides the external clock signal at a frequency-dividing ratio of 2/8, and outputs a dummy clock Z and a reference clock X. The dummy clock Z is at a high level H during a period equal to two cycles of the external clock signal and is at a low level L during a period equal to six cycles thereof. The reference clock X is the inverted version of the dummy clock Z. That is, the reference clock X is at the low level L during the period equal to two cycles of the external clock signal, and is at the high level H during the period equal to six cycles thereof.

The reference clock X is supplied to a phase comparator 158, while the dummy clock Z passes through a dummy delay circuit 160 and a dummy circuit 162, and is then supplied to the phase comparator 158. The dummy circuit 162 has the same circuit configurations as those of the input circuit 152 and an output circuit 168. The phase comparator 158 compares the phase of the delayed dummy clock Z with the phase of the reference clock X and results in a phase difference signal, which is supplied to the delay control circuit 164. The delay control circuit 164 controls, on the basis of the phase difference signal, a delay amount of the dummy delay circuit 160 so that the phase difference becomes zero. Thus, the delay amount of the dummy delay circuit 160 is controlled so that the rising edge of the dummy clock Z coincides with the rising edge of the reference clock X, that is, the delayed dummy clock Z lags behind the reference clock X by a delay of time equal to k cycles (k=2 in the case being concerned) of the external clock signal.

The delay circuit 154 supplied with the real clock has the same configuration as the dummy delay circuit 160, and is set to the same delay amount as that of the dummy delay circuit 160 by the delay control circuit 164. The real clock delayed by the delay circuit 154 is supplied to the output circuit 168. The output circuit 168 buffers data on a data bus in synchronism with the real clock, and outputs buffered data via a data output pad 170.

The dummy circuit 168 has the same configurations as those of the input circuit 152 and the output circuit 168. Thus, the data output by the data output pad 170 is in phase with the external clock signal applied to the clock input pad 150 in the state in which the delayed dummy clock Z lags behind the reference clock X by the delay of time equal to k cycles of the external clock signal.

The conventional circuit shown in FIG. 1 employs the frequency divider 156 which has a fixed frequency dividing ratio. In case where there is a small variable range of the frequency of the external clock signal, the circuit shown in FIG. 1 will operate properly. In contrast, if the external clock signal changes over a wide frequency range, an underflow will occur when the frequency of the external clock signal becomes high. The underflow is defined so that the delay control circuit 164 continues to generate the signal which further reduces the delay amount nevertheless the delay circuits 154 and 160 respectively set the minimum delay amounts. In this case, the phase difference signal generated by the phase comparator 158 does not become zero, and thus the on-lock state cannot be obtained.

It is conceivable to increase the frequency dividing ratio of the frequency divider 156 and delay the rising edge of the reference clock X. However, in the above case, a situation in which the frequency of the external clock signal becomes low cannot be processed unless the delay circuits 154 and 160 are modified to have an increased number of delay stages in accordance with the delayed rising edge of the reference clock X. This increases the chip area. Further, the DLL circuit becomes likely to be affected by power system noise resulting from a variation in the power supply voltage because the above noise results from an accumulation of fine variations in the delay times in the respective delay stages.

SUMMARY OF THE INVENTION

It is a general object of the present invention to provide a semiconductor integrated circuit device in which the above disadvantages are eliminated.

A more specific object of the present invention is to provide a semiconductor integrated circuit device which does not cause an underflow and an overflow of a DLL circuit even if the frequency of the external clock becomes high and low, respectively and which needs no increase of the chip area and is hardly likely to be affected by power system noise.

The above objects of the present invention are achieved by a semiconductor integrated circuit device comprising a delayed locked loop circuit, which comprises: a frequency divider which frequency-divides an input clock at a frequency dividing ratio which is varied depending on a frequency of the input clock and thus results in a dummy clock and a reference clock; a delay system including a variable delay circuit which delays the dummy clock; and a control circuit which controls a delay amount of the variable delay circuit so that a phase of a delayed dummy clock from the delay system and the reference clock becomes zero.

The above objects of the present invention are also achieved by a semiconductor integrated circuit device comprising a 1/2 frequency divider which frequency-divides an input clock at a frequency dividing ratio of 1/2; a selector circuit which selects one of the input clock and a frequency-divided clock from the 1/2 frequency divider in accordance with a frequency of the input clock; and a delayed locked loop circuit including: a frequency divider which frequency-divides a selected clock from the selector circuit and produces a dummy clock and a reference clock; a delay system including a variable delay circuit which delays the dummy clock; a control circuit which controls a delay amount of the variable delay circuit so that a phase of a delayed dummy clock from the delay system and the reference clock becomes zero.

BRIEF DESCRIPTION OF THE DRAWINGS

Other objects, features and advantages of the present invention will become more apparent from the following detailed description when read in conjunction with the accompanying drawings, in which:

FIG. 13A is a circuit diagram of a unit delay circuit used in the present invention;

FIG. 13B is a waveform diagram of an operation of the unit delay circuit shown in FIG. 13A;

FIG. 13C is a circuit diagram of an arrangement in which unit delay circuits are cascaded;

FIGS. 28A, 28B and 28C are respectively diagrams explaining an automatic clock cycle detection circuit which functions as a frequency dividing ratio setting part;

DESCRIPTION OF THE PREFERRED EMBODIMENTS

Figure 1:
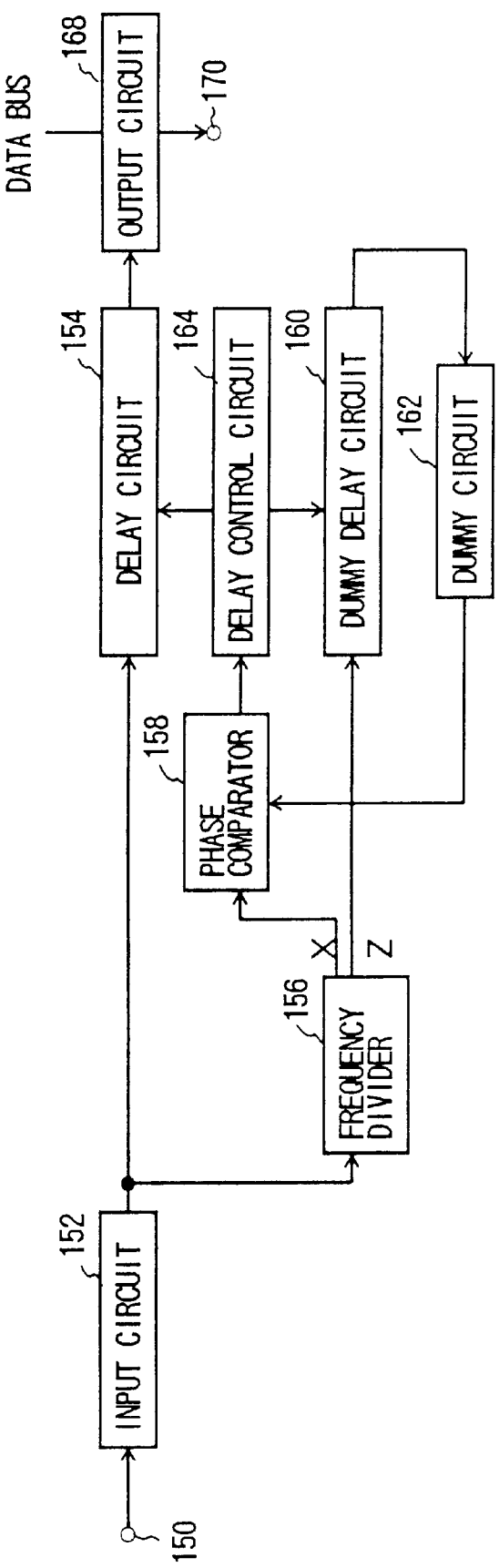
FIG. 1 is a block diagram of a conventional DLL circuit.
Figure 2:
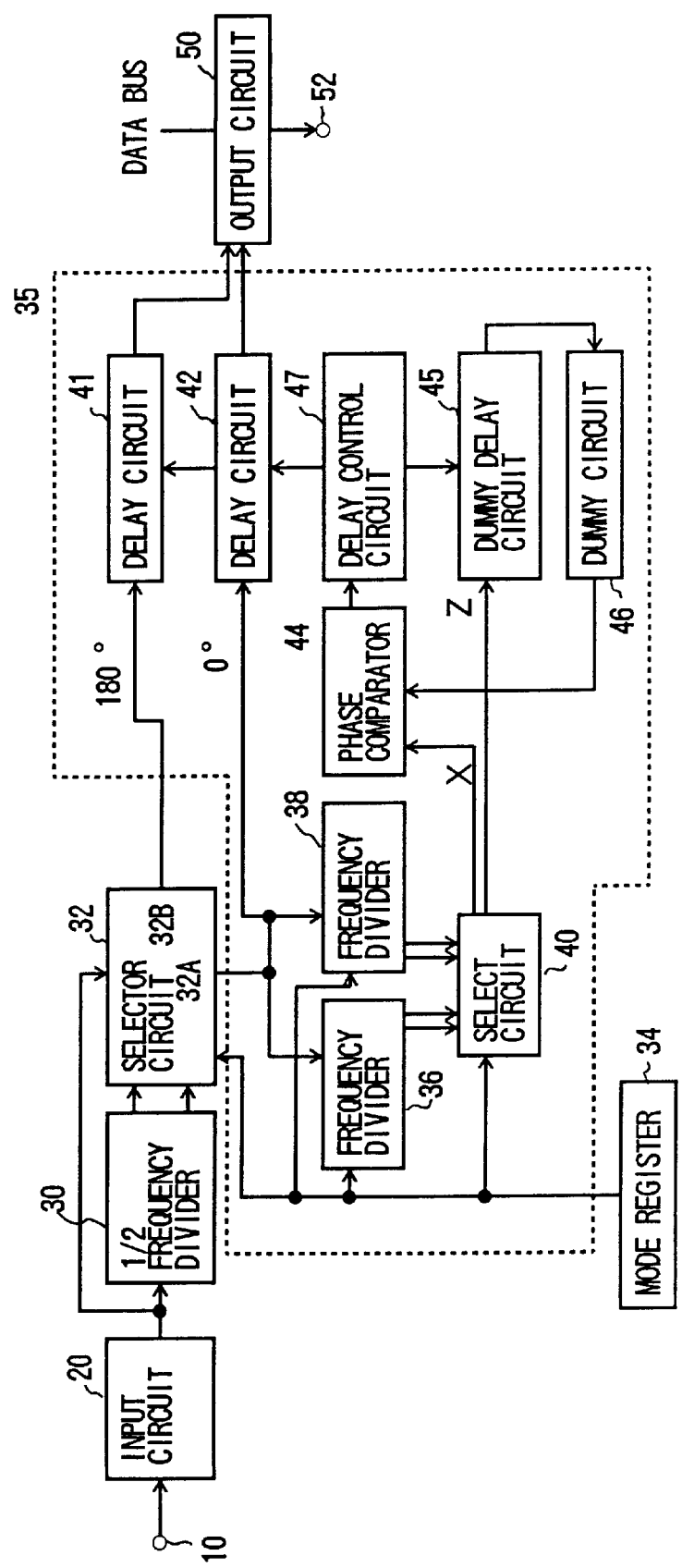
FIG. 2 is a block diagram of a semiconductor integrated circuit device according to a first embodiment of the present invention.

FIG. 2 is a block diagram of a DLL circuit according to a first embodiment of the present invention. An external clock externally supplied to a clock input pad 10 passes through an input circuit 20, which functions as a buffer, and is then supplied to a 1/2 frequency divider 30 and a selector circuit 32. The 1/2 frequency divider 30 divides the external clock at a frequency dividing ratio of 1/2 and results in two frequency-divided clocks which are accurately 180 degrees out of phase.

Figure 3:
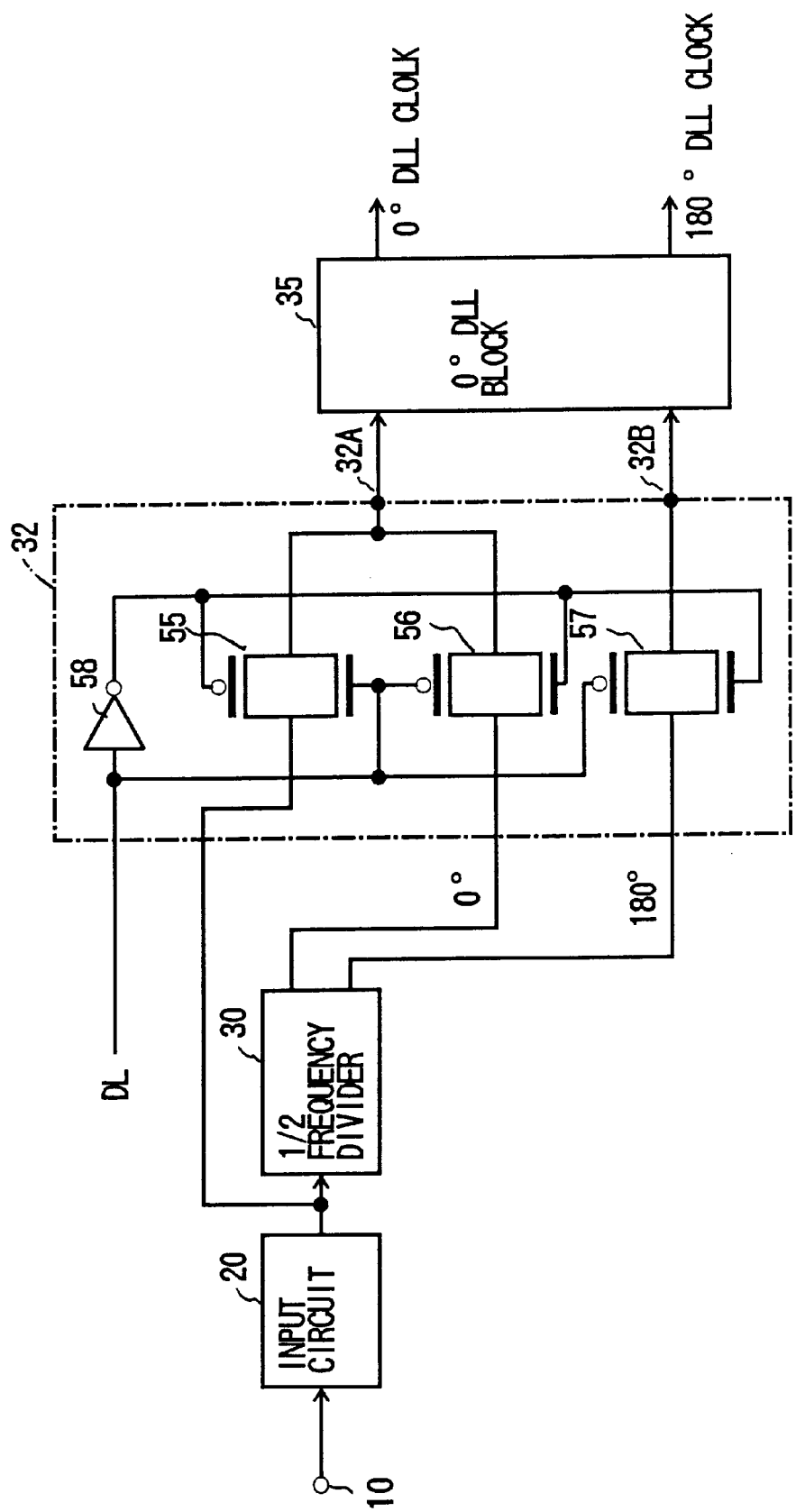
FIG. 3 is a block diagram of a selector circuit used in the configuration shown in FIG. 2.

The selector circuit 32 has a configuration shown in FIG. 3, and includes transfer gates 55, 56 and 57, and an inverter 58. The transfer gate 55 is supplied with the output signal of the input circuit 20. The transfer gate 56 is supplied with the frequency-divided signal (0 degree) from the 1/2 frequency divider 30. The transfer gate 57 is supplied with the inverted frequency-divided signal (180 degrees) from the 1/2 frequency divider 30. The inverter 58 inverts a mode signal DL. The mode signal DL and the inverted mode signal thereof are applied to the transfer gates 55, 56 and 57.

The mode signal DL becomes high in a state in which a data latency is equal to 3, and is supplied from a mode register 34 shown in FIG. 2. The data latency describes an operation speed (operation mode) of an output circuit 50, and becomes larger as the frequency of the external clock becomes higher. When the mode signal DL is at the high level H (the external clock has the lowest frequency), the selector circuit 32 operates so that the transfer gate 55 is ON and the transfer gates 56 and 57 are OFF. The external clock passing through the input circuit 20 and the transfer gate 55 is output via a terminal 32A of the selector circuit 32, and is then supplied to a 0-degree DLL block 35. At that time, no signal is output via a terminal 32B of the selector circuit 32.

When the mode signal DL is at the low level L, the transfer gates 56 and 57 are ON and the transfer gate 55 is OFF. Thus, the frequency-divided clock passing through the transfer gate 56 and the inverted frequency-divided clock passing through the transfer gate 57 are respectively output via the terminals 32A and 32B and are then supplied to the 0-degree DLL block 35.

The signal output via the terminal 32A of the selector circuit 32 (which is the frequency-divided clock when DL=L and is the external clock when DL=H) is supplied to frequency dividers 36 and 38 and a delay circuit 42 of the 0-degree DLL block 35 shown in FIG. 2. The signal output via the terminal 32B of the selector circuit 32 (which is the inverted frequency-divided clock when DL=L and is nothing when DL=H) is supplied to a delay circuit 41 of the 0-degree DLL block 35.

The frequency divider 36 divides the frequency-divided clock or the external clock at a frequency dividing ratio of, for example, 1/4. Hence, the frequency divider 36 generates the dummy clock Z which is at the high level H during the period equal to one cycle of the clock supplied thereto and is at the low level L during the period equal to three cycles thereof. Further, the frequency divider 36 generates the reference clock X which is the inverted version of the dummy clock Z. More particularly, the reference clock X is at the low level L during the period equal to one cycle of the clock supplied to the frequency divider 36 and is at the high level H during the period equal to three cycles thereof. The dummy clock Z and the reference clock X are then supplied to a selector circuit 40.

The frequency divider 38 divides the frequency-divided clock or the external clock at a frequency dividing ratio of, for example, 2/4. Hence, the frequency divider 38 generates the dummy clock Z which is at the high level H during the period equal to two cycles of the clock supplied thereto and is at the low level L during the period equal to two cycles thereof. Further, the frequency divider 38 generates the reference clock X which is the inverted version of the dummy clock Z. More particularly, the reference clock X is at the low level L during the period equal to two cycles of the clock supplied to the frequency divider 38 and is at the high level H during the period equal to two cycles thereof. The dummy clock Z and the reference clock X are then supplied to a selector circuit 40.

The selector circuit 40 selects the dummy clock Z and the reference clock X output by the frequency divider 36 when a mode signal LF (which is at the high level H when the data latency is equal to six) supplied from the mode register 34 is at the high level H. Also, the selector circuit 40 selects the dummy clock Z and the reference clock X output by the frequency divider 38 when a mode signal HF (which is at the high level H when the data latency is equal to 10 or 12) supplied from the mode register 34 is at the high level H. The reference clock X thus selected is supplied to a phase comparator 44, and the dummy clock thus selected passes through a dummy delay circuit 45 and a dummy circuit 46, and is then supplied to the phase comparator 44.

The dummy circuit 46 has the same configurations as those of the input circuit 20, the 1/2 frequency divider 30 and the output circuit 50 and has the same delay amounts as those thereof. The phase comparator 44 compares the phase of the delayed dummy clock dZ from the dummy circuit 46 with the phase of the reference clock X from the phase comparator 44, and results in a phase difference signal, which is supplied to a delay control circuit 47. The delay control circuit 47 controls, on the basis of the phase difference signal, the delay amount of the dummy delay circuit 45 so that the phase difference becomes zero. Thus, the delay amount of the dummy delay circuit 45 is controlled so that the rising edge of the dummy clock dZ coincides with the rising edge of the reference clock X, that is, the delayed dummy clock dZ lags behind the reference clock X by a delay of time equal to k cycles (k=2 in the case being concerned) of the external clock.

The delay circuit 41 supplied with the inverted frequency-divided clock and the dummy delay circuit 42 supplied with the frequency-divided clock have the same configuration as the dummy delay circuit 45, and are controlled, by the delay control circuit 47, to have the same delay amounts as that of the dummy delay circuit 45. The frequency-divided clock (0-degree clock) delayed by 360 degrees by the delay circuit 42 is supplied, as the real clock, to the output circuit 50, and the frequency-divided clock (180-degree clock) delayed by 180 degrees by the delay circuit 41 is supplied, as the inverted real clock, to the output circuit 50. The output circuit 50 buffers data on the data bus in synchronism with the real clock and the inverted real clock, and outputs buffered data via a data output pad 52. That is, the data output from the output circuit 50 is synchronized with the input clock externally supplied via the clock input pad 10.

The frequency-divided clock (0-degree clock) and the 180-degree-delayed frequency-divided clock (180-degree clock) are generated by the 0-degree DLL block 35 when the mode signal LF is at the high level H (the data latency is equal to 6) and the mode signal HF is at the high level H (the data latency is equal to 10 or 12). This is because high-speed access of a doubled access speed can be performed by reading data from a DRAM (from which data is supplied to the output circuit 50) in synchronism with the 0-degree clock and the 180-degree clock in a state in which the external clock of the data latency of 6, 10 or 12 has a high frequency.

The selector circuit 32 selects the external clock which has not been subjected to the 1/2 frequency dividing process and outputs it, via the terminal 32A, to the delay circuit 41 of the 0-degree DLL block 35, while the selector circuit 32 supplies no signal to the delay circuit 42 via the output terminal 32B. This is because, in the state in which the data latency is equal to 3 and the external clock has the lowest frequency, the access can be performed well by operating the DRAM (from which data is supplied to the output circuit 50) in synchronism with only the 180-degree clock.

As described above, the above-mentioned DLL circuit selects, in accordance with the frequency of the input clock, either the input clock or the clock which has been subjected to the 1/2 frequency dividing process by the 1/2 frequency divider. The selected clock is supplied to the frequency dividers 36 and 38. Hence, it is possible to prevent occurrence of an underflow or overflow even if the frequency of the input clock changes widely.

Figure 4:
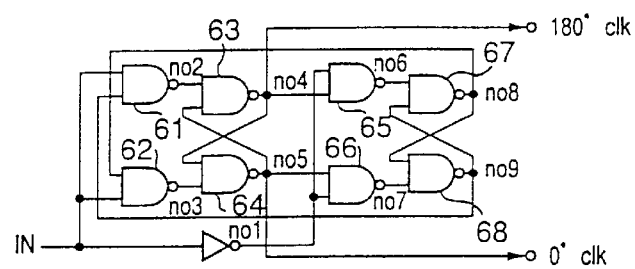
FIG. 4 is a circuit diagram of a 1/2 frequency divider used in the configuration shown in FIG. 2.
Figure 5:
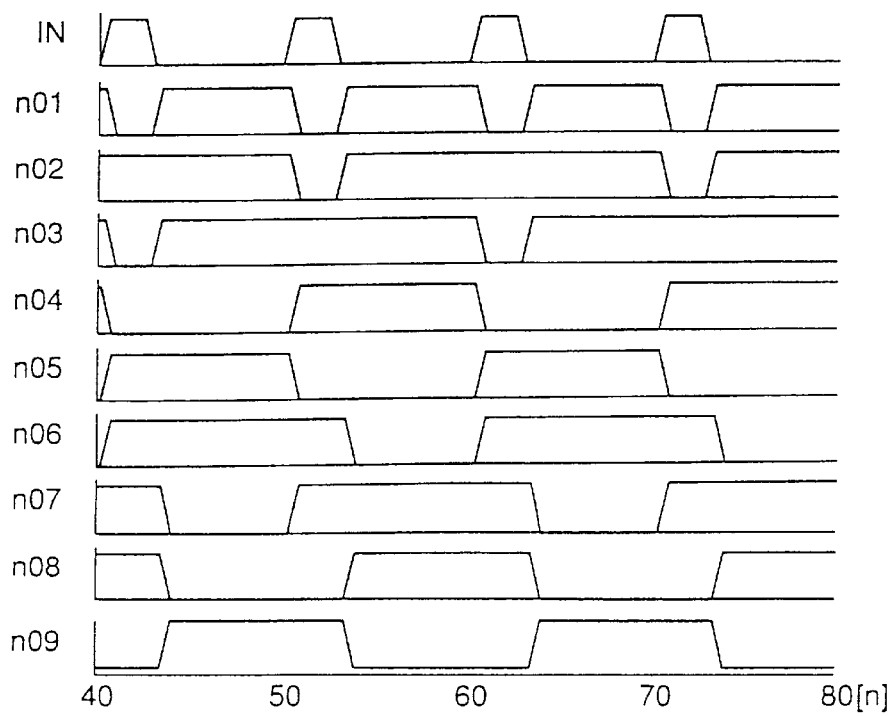
FIG. 5 is a timing chart of an operation of the 1/2 frequency divider shown in FIG. 4.

FIG. 4 is a circuit diagram of the 1/2 frequency divider 30 shown in FIG. 2. FIG. 5 is a waveform diagrams of signals obtained at nodes in the 1/2 frequency divider 30. As shown in FIG. 4, the 1/2 frequency divider 30 includes NAND gates 61–68 and an inverter 69. A signal IN (which is the external clock from the input circuit 10) is supplied to NAND gates 61 and 62 of a first gate part. Also, the signal IN is inverted by the inverter 69, and is then supplied to the NAND gates 65 and 66 of a second gate part.

The NAND gates 61 and 62 are supplied with outputs of the NAND gates 68 and 67 of a slave latch part. The outputs of the NAND gates 61 and 62 are supplied to the NAND gates 63 and 64 of a master latch part. The NAND gates 63 and 64 are respectively supplied with outputs of the NAND gates 64 and 63, and complementary output signals of the NAND gates 63 and 64 are respectively supplied to the NAND gates 65 and 66. The NAND gates 67 and 68 are respectively supplied with the outputs of the NAND gates 65 and 66, and the complementary output signals of the NAND gates 67 and 68 are respectively supplied to the NAND gates 68 and 67.

The output terminals of the NAND gates 61–68 respectively correspond to nodes nd2–nd9. When the signal available at the node nd5 is taken as the frequency-divided clock, the inverted frequency-divided clock which is 180 degrees out of phase with respect to the frequency-divided clock is available at the node nd4. The frequency-divided clock thus obtained is supplied to the delay circuit 42 and the frequency divider 43 shown in FIG. 2, and the inverted frequency-divided clock is supplied to the delay circuit 41.

As described above, the complementary output signals of the slave latch part are gated by the input clock and are latched in the master latch part. Further, the complementary output signals of the master latch part are gated by the inverted input clock and are latched in the slave part. Then, the complementary output signals of the master latch part are output. Hence, it is possible to shift the phases of the first and second frequency-divided signals so that a phase difference of 180 degrees can accurately be obtained.

Figure 6:
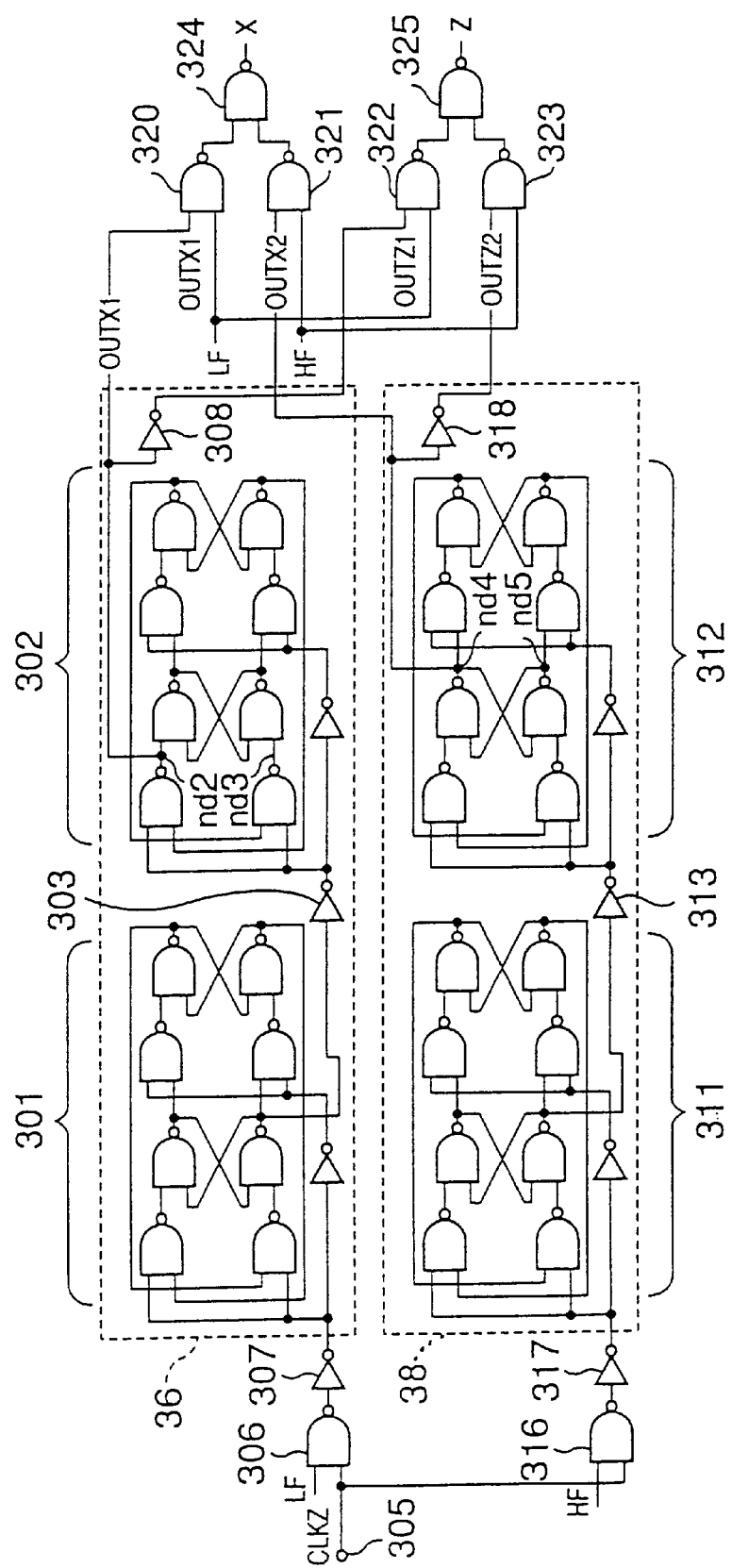
FIG. 6 is a circuit diagram of a configuration of frequency dividers 36 and 38 and a selector circuit 40 used in the configuration shown in FIG. 2.

FIG. 6 is a circuit diagram of configurations of the frequency dividers 36 and 38 and the selector circuit 40 shown in FIG. 2. As shown in FIG. 6, the frequency divider 36 includes 1/2 frequency dividers 301 and 302 and an inverter 303, which are cascaded. Each of the 1/2 frequency dividers 301 and 302 has the same configuration as shown in FIG. 4. When the mode signal HL is at the high level H, the clock CLKZ applied to a terminal 305 passes through a NAND gate 306 and an inverter 307, and is supplied to the 1/2 frequency divider 301. A signal obtained at a node nd2 of the 1/2 frequency divider 302 is supplied to a NAND gate 320 of the selector circuit 40. Further, the signal at the node nd2 is inverted by an inverter 308, and is then supplied to a NAND gate 322 of the selector circuit 40. Alternatively, a signal obtained at a node nd3 may be supplied to a NAND gate 321 without the inverter 308.

The frequency divider 38 includes 1/2 frequency dividers 311 and 312 and an inverter 313, which are cascaded. Each of the 1/2 frequency dividers 311 and 312 has the same configuration as shown in FIG. 4. When the mode signal HF is at the high level H, the clock CLKZ applied to the terminal 305 passes through a NAND gate 316 and an inverter 317, and is supplied to the 1/2 frequency divider 311. A signal obtained at a node nd4 of the 1/2 frequency divider 312 is supplied to a NAND gate 321 of the selector circuit 40. Further, the signal at the node nd2 is inverted by an inverter 318, and is then supplied to a NAND gate 323 of the selector circuit 40. Alternatively, a signal obtained at a node nd5 may be supplied to the NAND gate 323 without the inverter 318.

In the selector circuit 40, when the mode signal LF is at the high level H, the output signals of the NAND gates 320 and 322 are selected and are output via the NAND gates 324 and 325 as the reference clock X and the dummy clock Z, respectively. When the mode signal HF is at the high level H, the output signals of the NAND gates 321 and 323 are selected and are output via the NAND gates 324 and 325 as the reference clock X and the dummy clock Z, respectively.

Figure 7:
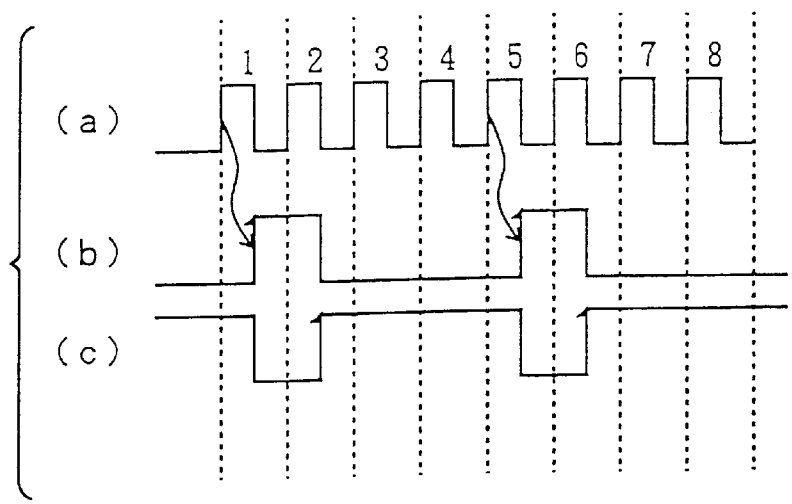
FIG. 7 is a waveform diagram of input and output signals of the frequency divider 36.
Figure 8:
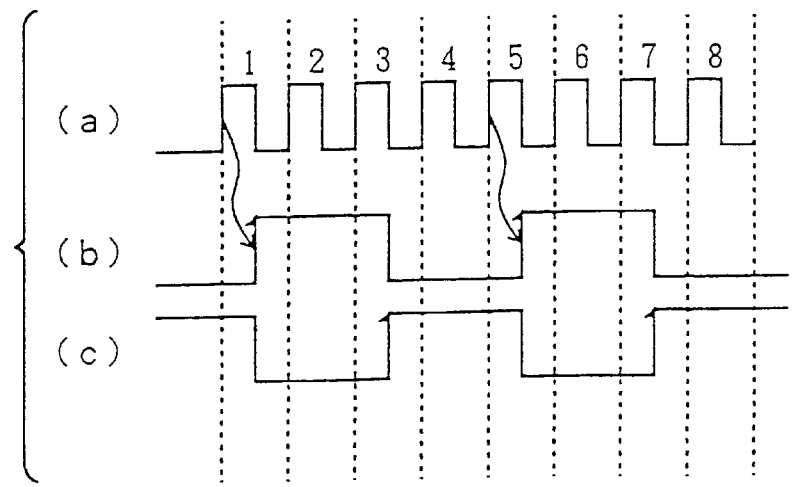
FIG. 8 is a waveform diagram of input and output signals of the frequency divider 38.

Thus, when the mode signal LF is at the high level H, the dummy clock Z shown in part (b) of FIG. 7 and the reference clock X shown in part (c) thereof are output from the clock applied to the terminal 305 and shown in part (a). The delay control circuit 47 controls the rising edge of the delayed dummy clock dZ obtained by passing through the dummy delay circuit 45 and the dummy circuit 46 to coincide with the rising edge of the reference clock X. When the mode signal HF is at the high level H, the dummy clock Z shown in part (b) of FIG. 8 and the reference clock X shown in part (c) thereof are output from the clock applied to the terminal 305 and shown in part (a). The delay control circuit 47 controls the rising edge of the delayed dummy clock dZ obtained by passing through the dummy delay circuit 45 and the dummy circuit 46 to coincide with the rising edge of the reference clock X.

Figure 9:
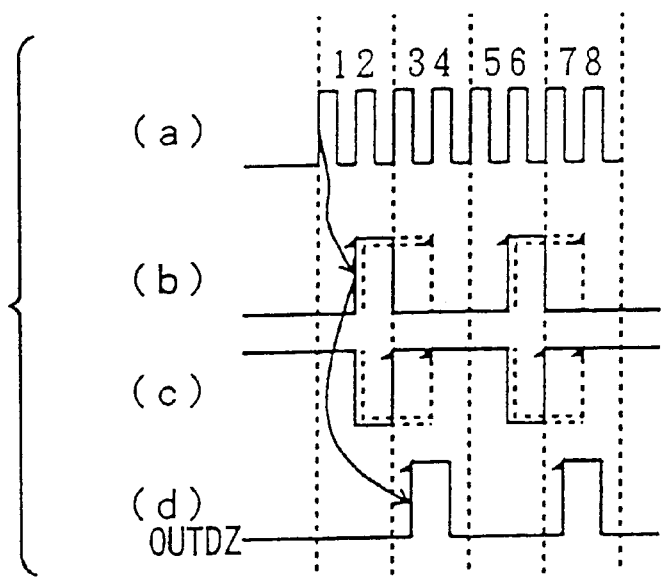
FIG. 9 is a waveform diagram for explaining a select operation of the frequency dividing circuit used in the semiconductor integrated circuit device of the invention.

If the clock shown in part (a) of FIG. 9 and applied to the terminal 305 falls in a high-frequency band, the dummy clock Z and the reference clock X depicted by the solid lines shown in parts (b) and (c) thereof will be obtained. In this case, even when the dummy delay circuit 45 is controlled to have the minimum delay amount, an underflow occurs in which the rising edge of the dummy clock dZ delayed by the dummy delay circuit 45 and the dummy circuit 46 and shown in part (d) of FIG. 9 lags behind the rising edge off the reference clock X. However, according to the present invention, the frequency dividing ratio is increased so that the dummy block Z and the reference clock X depicted by the broken lines respectively shown in parts (b) and (c) of FIG. 9. Thus, by controlling the delay mount of the dummy delay circuit 45, it is possible to cause the rising edge of the dummy clock dZ shown in part (d) of FIG. 9 to coincide with the rising edge of the reference clock X (depicted by the broken line).

Figure 10:
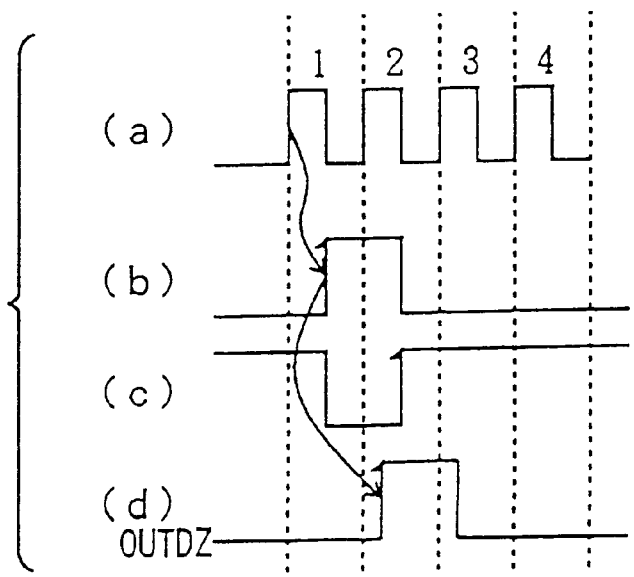
FIG. 10 is another waveform diagram for explaining the select operation of the frequency dividing circuit used in the semiconductor integrated circuit device of the invention.
Figure 11:
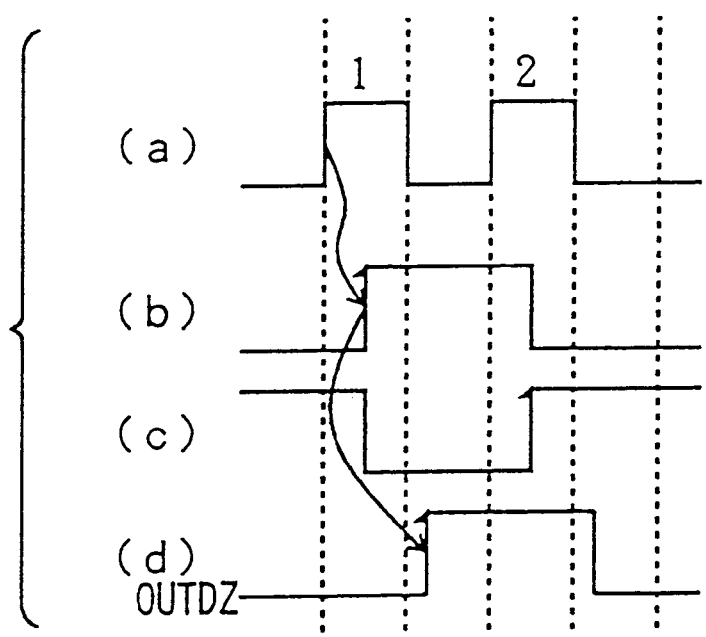
FIG. 11 is yet another waveform diagram for explaining the select operation of the frequency dividing circuit used in the semiconductor integrated circuit device of the invention.

If the clock applied to the terminal 305 and shown in part (a) of FIG. 11 falls in a low-frequency band, the dummy clock Z and the reference clock X are obtained as shown in parts (b) and (c) thereof, respectively. Hence, even when the dummy delay circuit 45 is controlled to have the maximum delay amount, an overflow will occur in which the rising edge of the dummy clock dZ delayed by the dummy delay circuit 45 and the dummy circuit 46 and shown in part (d) of FIG. 11 leads to the rising edge of the reference clock X. However, according to the present invention, the frequency dividing ratio is decreased so that the dummy clock Z and the reference clock X respectively shown in parts (b) and (c) of FIG. 10 can be obtained from the clock shown in part (a) of FIG. 10. Hence, it is possible to cause the rising edge of the dummy clock dZ shown in part (d) of FIG. 10 to coincide with the rising edge of the reference clock X (depicted by the broken line).

As described above, the frequency dividing ratio is increased so as to prevent the occurrence of underflow when the input clock is relatively high, and is decreased so as to prevent the occurrence of overflow when the input clock is relatively low. It is not required to employ a larger number of delay stages and a larger chip area, so that the DLL circuit is less liable to be affected by power system noise.

Figure 12:
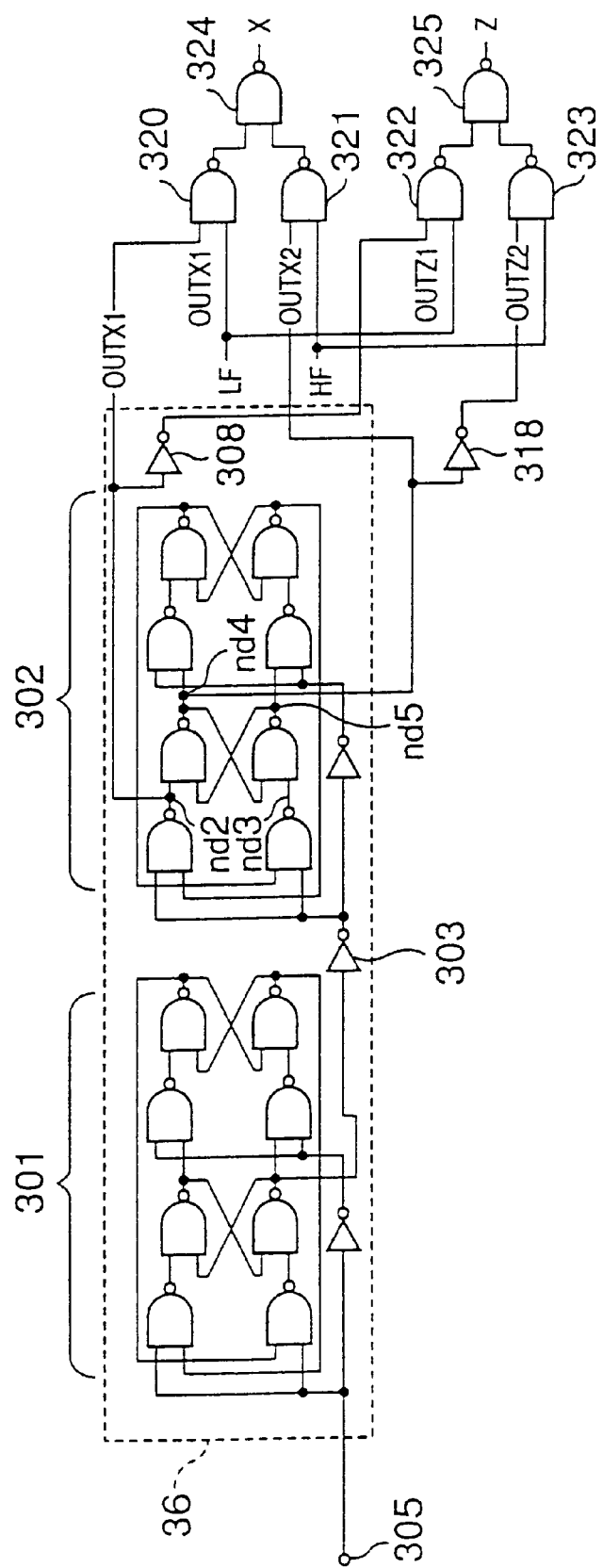
FIG. 12 is a circuit diagram of another configuration of the frequency dividers 36 and 38 and the selector circuit 40 used in the configuration shown in FIG. 2.

Alternatively, it is possible to omit the frequency divider 38 shown in FIG. 6 and employ only the frequency divider 36, as shown in FIG. 12. In this case, the 1/4 and 2/4 frequency divisions are performed. Referring to FIG. 12, the clock applied to the terminal 305 is directly supplied to the 1/2 frequency divider 301. The signal output via the node nd2 of the 1/2 frequency divider 302 is supplied to the NAND gate 320 of the selector circuit 40. Further, the above signal output via the node nd2 is inverted by the inverter 308 and is supplied to the NAND gate 322 of the selector circuit 40. The signal output via the node nd4 of the 1/2 frequency divider 302 is supplied to the NAND gate 321 of the selector circuit 40. Further, the signal output via the node nd4 is inverted by the inverter 318 and is supplied to the NAND gate 323 of the selector circuit 40.

In the circuit configuration shown in FIG. 12, an input terminal of a dummy NAND gate (the output terminal thereof is open) having the same configuration as the NAND gate 320 may be connected to the node nd3 of the 1/2 frequency divider 302 in order to be balanced with the NAND gate 320 connected to the node nd2. Similarly, an input terminal of a dummy NAND gate (the output terminal thereof is open) having the same configuration as the NAND gate 321 may be connected to the node nd5 of the 1/2 frequency divider 302 in order to be balanced with the NAND gate 321 connected to the node nd4.

FIGS. 13A, 13B and 13C are diagrams for explaining a configuration of the delay circuits 41 and 42 and the dummy delay circuit 45 having an identical configuration. More particularly, FIG. 13A is a circuit diagram of a unit delay circuit equal to one bit, and FIG. 13B is a timing chart of an operation of the unit delay circuit. FIG. 13C shows a configuration in which a plurality of unit delay circuits are cascaded.

As shown in FIG. 13A, the unit delay circuit is made up of two NAND gates 401 and 402, and an inverter 403. Referring to FIG. 13B, a signal $\phi E$ is an enable signal. When the enable signal $\phi E$ is high (H), the unit delay circuit is activated. FIG. 13B shows the enable signal $\phi E$ is high and the unit delay circuit is enabled. A signal IN is an input signal applied to the unit delay circuit, and a signal $\phi N$ is transferred from the unit delay circuit located at the right-hand side of the unit delay circuit shown in FIG. 13A. Further, a symbol OUT denotes the output signal of the unit delay circuit shown in FIG. 13A. The output signal OUT is the signal $\phi N$ for the unit delay circuit located at the left-hand side of the unit delay circuit shown in FIG. 13A. Signals 4a-1 and 4a-2 shown in FIG. 13B are obtained at nodes 4a-1 and 4a-2 shown in FIG. 13A.

When the signal $\phi N$ is low (L), the output signal OUT is low. When the signal $\phi N$ is high and the signal $\phi E$ is low, the output signal OUT is high. When the signal $\phi N$ is high and the signal $\phi E$ is high, the output signal OUT is high if the input signal IN is low, and is low if the input signal IN is high.

The unit delay circuit shown in FIG. 13A can be summarized as follows. When the enable signal $\phi E$ is high and the input signal IN rises, the input signal IN is allowed to pass through the elements 401–403 as indicated by the arrow in FIG. 13A. When the enable signal $\phi E$ is low, the input signal IN is inhibited to pass through the NAND gate 401.

In FIG. 13C, only three stages of unit delay circuits are shown. In practice, a larger number of unit delay circuits are cascaded in order to realize the delay circuits 33 and the dummy delay circuit 34. The stages of unit delay circuits are supplied with respective enable signals $\phi E$-1, $\phi E$-2 and $\phi E$-3, which are controlled by the delay control circuit 32, as will be described later.

In FIG. 13C, the enable signal $\phi E$-2 is high and the unit delay circuit located at the center is thus activated. Hence, the input signal IN is allowed to pass through the NAND gate 401-2. The enable signals $\phi E$-1 and $\phi E$-3 are low, and thus the input signal IN cannot pass through the NAND gates 401-1 and 401-3.

The output signal OUT of the unit delay circuit located at the right-hand side of the central unit delay circuit is high, and thus the input signal IN can pass through the NAND gate 402-2, and then passes through the inverter 403-2. The output signal OUT of the inverter 403-2 is low and is supplied to the unit delay circuit located at the left-hand side of the central unit delay circuit as the output signal OUT. Since the enable signal $\phi E$-1 is low, the output signal of the NAND gate 401-1 is high. Hence, the low-level output signal OUT from the central unit delay circuit can pass through the NAND gate 402-1 and is applied to the next stage via the inverter 403-1.

As described above, the input signal IN is switched back by the activated unit delay circuit. The delay amount can be varied by selecting one of the unit delay circuits to be activated. The delay amount depends on the number of NAND gates and the number of inverters through which the input signal passes.

Figure 14:
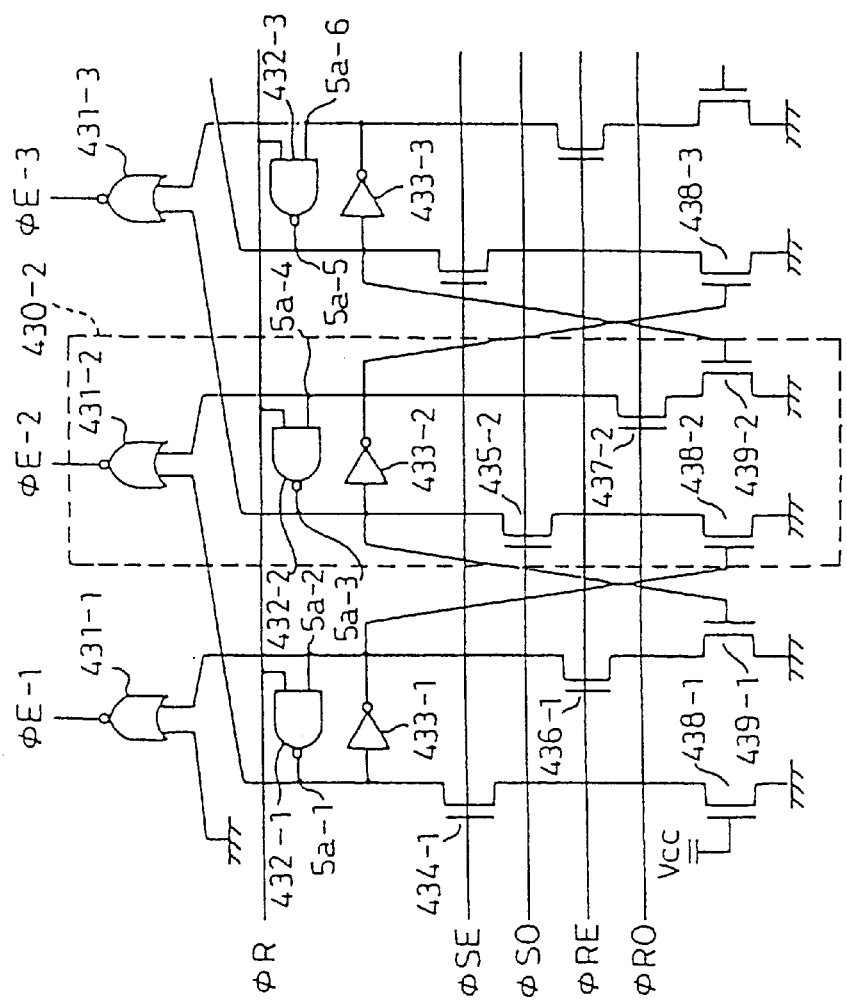
FIG. 14 is a circuit diagram of a delay control circuit shown in FIG. 2.

FIG. 14 is a circuit diagram of an example of the delay control circuit 32 shown in FIG. 6. The delay control circuit 32 has unit delay control circuits 430-2 equal in number to the stages of each of the delay circuit 33 and the dummy delay circuit 34. The output signals of the respective stages of the unit delay control circuits 430-2 serve as the aforementioned enable signals $\phi E$ applied to the respective stages of each of the delay circuit 33 and the dummy delay circuit 34.

The unit delay control circuit 430-2 includes a flip-flop made up of a NAND gate 432-2 and an inverter 433-2, a NOR gate 431-2, and transistors 435-2, 437-2, 438-2 and 439-2. The transistors 435-2 and 438-3 are connected in series, and are located on one side of the flip-flop. The transistors 437-2 and 439-2 are connected in series, and are located on the other side of the flip-flop. The gate of the transistor 438-2 is connected to a node 5a-2 of the unit delay control circuit located at the previous stage. The gate of the transistor 439-2 is connected to a node 5a-5 of the unit delay circuit located at the following stage. A set signal $\phi SE$ used for the count-up operation is applied to the corresponding transistor of each of the even-numbered stages. Another set signal $\phi SO$ used for the count-up operation is applied to the corresponding transistor of each of the odd-numbered stages. A reset signal $\phi RE$ used for the count-down operation is applied to the corresponding transistor of each of the even-numbered stages. Another reset signal $\phi RO$ used for the count-down operation is applied to the corresponding transistor of each of the odd-numbered stages.

As shown in FIG. 14, the set signal $\phi SO$ is applied to the gate of the transistor 435-2 of the unit delay control circuit 430-2 located at the center and assigned an odd number. The reset signal $\phi RO$ is applied to the gate of the transistor 437-2 of the unit delay control circuit 430-2. The set signal $\phi SE$ and the reset signal $\phi RE$ are applied to the two unit delay control circuits at both sides of the unit delay control circuit 430-2. The NOR gate 431-2 is supplied with a signal obtained at a node 5a-1 of the previous stage and a signal obtained at a node 5a-4 of the circuit 430-2. A signal $\phi R$ is used to reset the unit delay control circuits. The signal $\phi R$ is temporarily set to the low level, and is then maintained at the high level.

Figure 15:
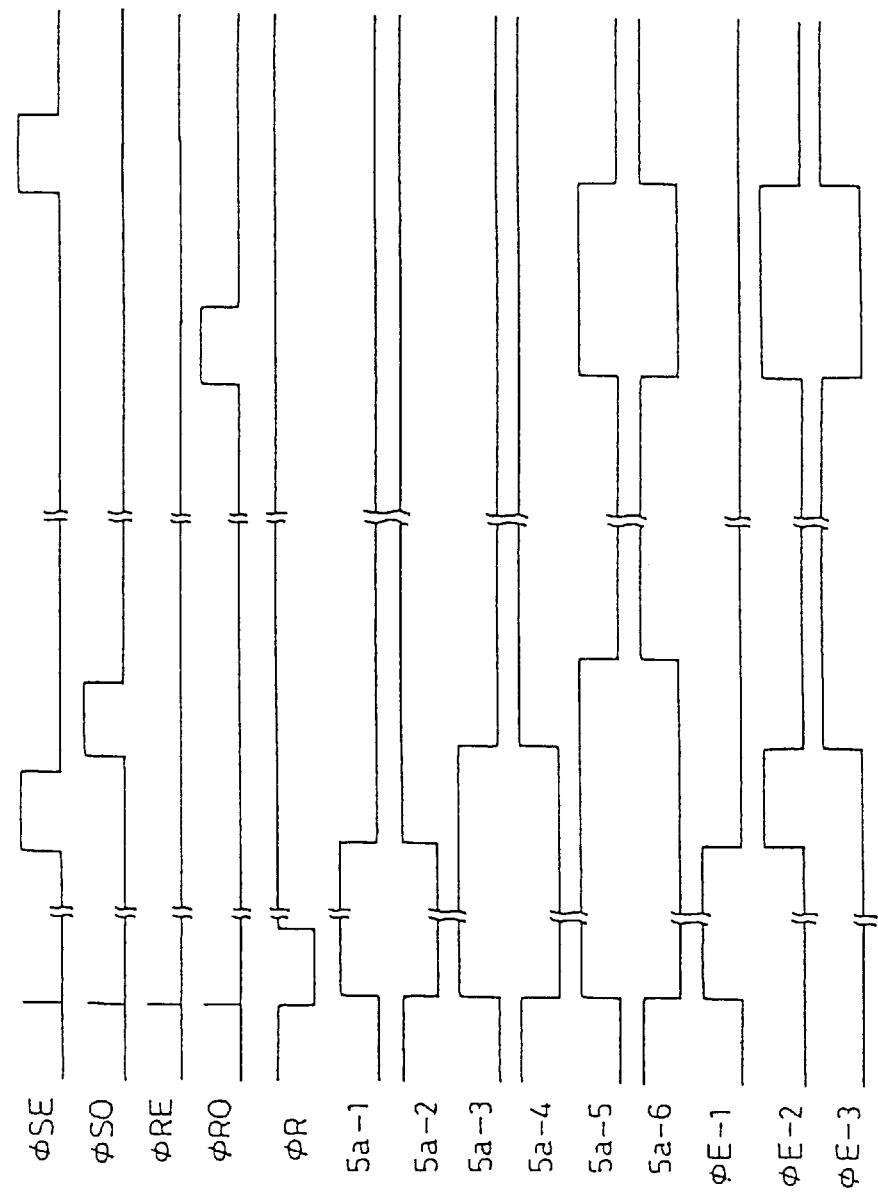
FIG. 15 is a timing chart of an operation of the delay control circuit shown in FIG. 14.

FIG. 15 is a timing chart of an operation of the delay control circuit 32. First, the reset signal $\phi R$ is temporarily set to the low level. Hence, the nodes 5a-1, 5a-3 and 5a-5 are set to the high level, and the nodes 5a-2, 5a-4 and 5a-6 are set to the low level. When the count-up operation is carried out, the count-up signals (set signals) $\phi E$ and $\phi O$ alternatively switch to the high and low levels.

When the set signal $\phi SE$ switches from the low level to the high level, the node 5a-1 is grounded and becomes low, while the node 5a-2 is switched to the high level. When the node 5a-2 is switched to the high level, the enable signal φE-1 is switched to the low level from the high level. This is latched by the flip-flop. Hence, even if the set signal φSE is returned to the low level, the enable signal φE-1 is maintained at the low level. When the node 5a-1 is switched to the low level, the enable signal φE-2 is switched to the high level from the low level. Since the node 5a-2 is switched to the high level, the transistor 438-2 is turned ON. When the set signal φSO switches from the low level to the high level, the node 5a-3 is grounded and becomes low, while the node 5a-4 is switched to the high level. Hence, the enable signal φE-2 is switched to the low level from the high level. This is latched by the flip-flop. Hence, even if the set signal φSO is returned to the low level, the enable signal φE-2 is maintained at the low level.

When the node 5a-3 is switched to the low level, the enable signal φE-3 is switched to the high level from the low level. When the set signals φSE and φSO alternately switch to the high and low levels, the enable signal φE set to the high level shifts rightwards. Hence, if the comparison result of the phase comparator circuit 31 indicates the delay amount should be increased, the set signals φSE and φSO are alternately switched to the high level.

When the set signals φSE and φSO and the reset signals φRE and φRO are all maintained at the low level, the stage which outputs the high-level enable signal φE is fixed. Hence, if the comparison result of the phase comparator circuit 31 indicates that the current delay amount should be maintained, the set signals φSE and φSO and the reset signals φRE and φRO are all maintained at the low level.

When the count-down operation is carried out, the reset signals φRE and φRO are alternately input. Hence, the high-level enable signal φE shifts leftwards.

In the above manner, the delay control stage circuit which outputs the high-level enable signal φE can be made to shift rightwards or leftwards one by one. The high-level enable signals φE thus generated are applied to the unit delay circuits, and one of the signals φE is set to the high level. Hence, the delay control can be performed with the precision of the unit delay time.

A description will now be given of the phase comparator circuit 31 shown in FIG. 6. The phase comparator circuit 31 includes a phase comparator part shown in FIG. 16, and an amplifier part shown in FIG. 18.

Figure 16:
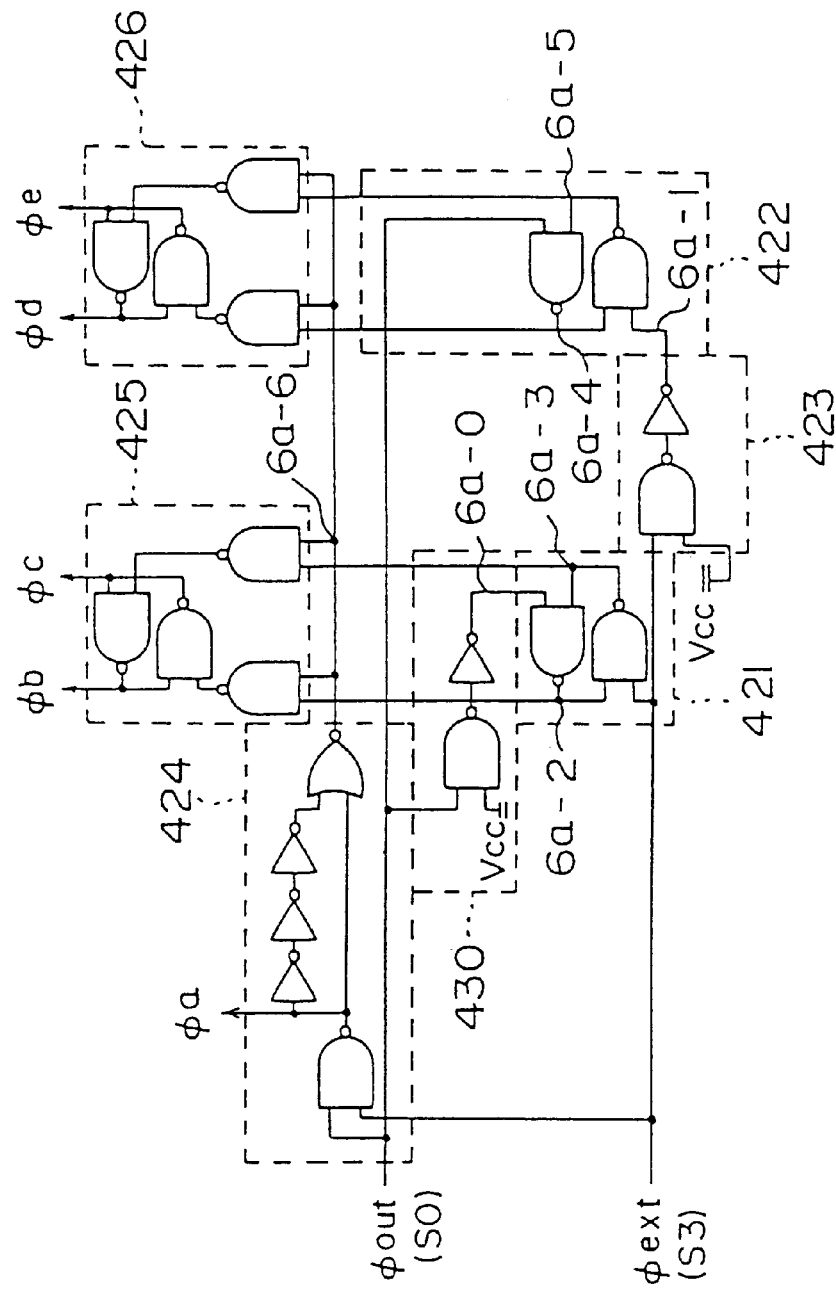
FIG. 16 is a circuit diagram of a phase comparator part of a phase comparator shown in FIG. 2.

In FIG. 16, φout and φext correspond to the output signal (S0) and the external clock (S3), respectively. The phase of the signal φout is detected with respect to the signal φext. Symbols φa through φe denote signals shown in FIG. 16, which are supplied to the amplifier part shown in FIG. 18.

As shown in FIG. 16, the phase comparator part of the phase comparator circuit 31 includes flip-flops 421 and 422, latch circuits 425 and 426, a circuit 424, a delay circuit 423, and a delay circuit 430. Each of the flip-flops 421 and 422 is made up of two NAND gates. The latch circuits 425 and 426 latch the states of the flip-flops 421 and 422, respectively. The circuit 424 generates an activating signal which activates the latch circuits 425 and 426. The delay circuit 423 delays the external clock φext by the unit delay amount. The delay circuit 430 delays the signal φout by the unit delay amount. The flip-flop 421 performs the phase comparing operation within the range between −td and 0. The flip-flop 422 performs the phase comparing operation within the range between 0 and +td.

Figure 17:
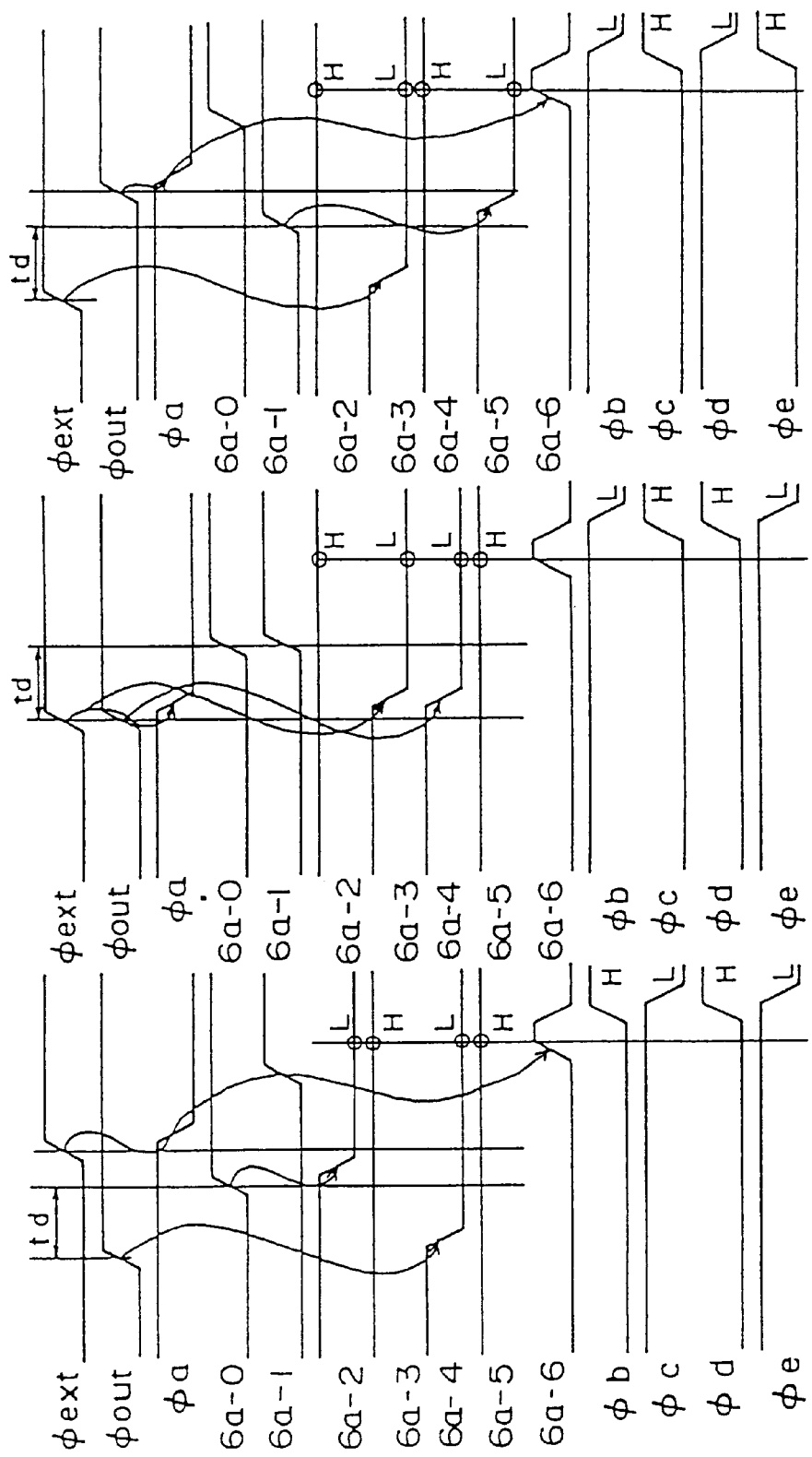
FIGS. 17A, 17B and 17C are timing charts of an operation of the phase comparator.

FIG. 17A shows a case where the signal φout leads, over td, to the signal φext serving as the reference for the comparing operation. In this case, the signal φout switches to the high level before the signal φext switches to the high level. When the signals φout and φext are both low, the nodes 6a-2, 6a-3, 6a-4 and 6a-5 of the flip-flops 421 and 422 are all high.

When the signal φout switches from the low level to the high level, the node 6a-4 is switched to the low level, and the node 6a-0 is switched to the high level with the unit delay (td). Hence, the node 6a-2 is switched to the low level. Thereafter, the signal φext switches to the high level, and the node 6a-1 is switched to the high level with the unit delay. At this time, the potentials of the two output terminals of each of the flip-flops 425 and 426 (that is, the potentials of the nodes 6a-2, 6a-3, 6a-4 and 6a-5) have been already settled. Hence, no changes of the states of the flip-flops 425 and 426 take place. Hence, the nodes 6a-2, 6a-3, 6a-4 and 6a-5 are respectively low, high, low and high.

When the external clock φext changes from the low level to the high level, the output signal φa of the circuit 424 is switched to the high level, and the pulse is temporarily applied to the node 6a-6. This node 6a-6 is the input of the latch circuit 425 and the input of the NAND gate 426. Hence, the NAND gate 426 is temporarily activated, and the latch circuits 425 and 426 latch the potentials of the output terminals of the flip-flops 421 and 422. Finally, the output signals φb, φc, φd and φe are respectively high, low, high and low.

FIG. 17B shows a case where the signals φout and text have almost the same phase (within td) as each other and switch to the high level at almost the same times. When the signal φout switches to the high level within the time difference between the rising of the signal out and the rising of the potential at the node 6a-1, the node 6a-3 of the flip-flop 421 is switched to the high level because the signal φext switches to the high level. The node 6a-1 of the flip-flop 422 is continuously low, and thus the node 6a-4 is switched to the low level. Thereafter, the node 6a-1 is switched to the low level. At this time, the state of the flip-flop 422 has been settled, and no change of the state thereof does not occur. Then, the node 6a-6 is temporarily switched to the high level, and thus the latch circuits 425 and 426 latch the states of the flip-flops 421 and 422. Hence, the output signals φb, φc, φd and φe are respectively low, high, high and low.

FIG. 17C shows a case where the signal φout lags, over td, behind the signal φext, and switches to the high level after the signal φext switches to the high level. In this case, the states of the flip-flops 421 and 422 are changed, and the nodes 6a-3 and 6a-5 are switched to the low level. Finally, the signals φb, φc, φd and φe are respectively low, high, low and high.

In the above-mentioned manner, it is possible to detect three cases shown in FIGS. 17A, 17B and 17C. The three cases are indicated by using the signals φb, φc, φd and φe, which are then used to determine which one of the count-up operation, count-down operation and no-count operation should be carried out in the delay control circuit 32.

Figure 18:
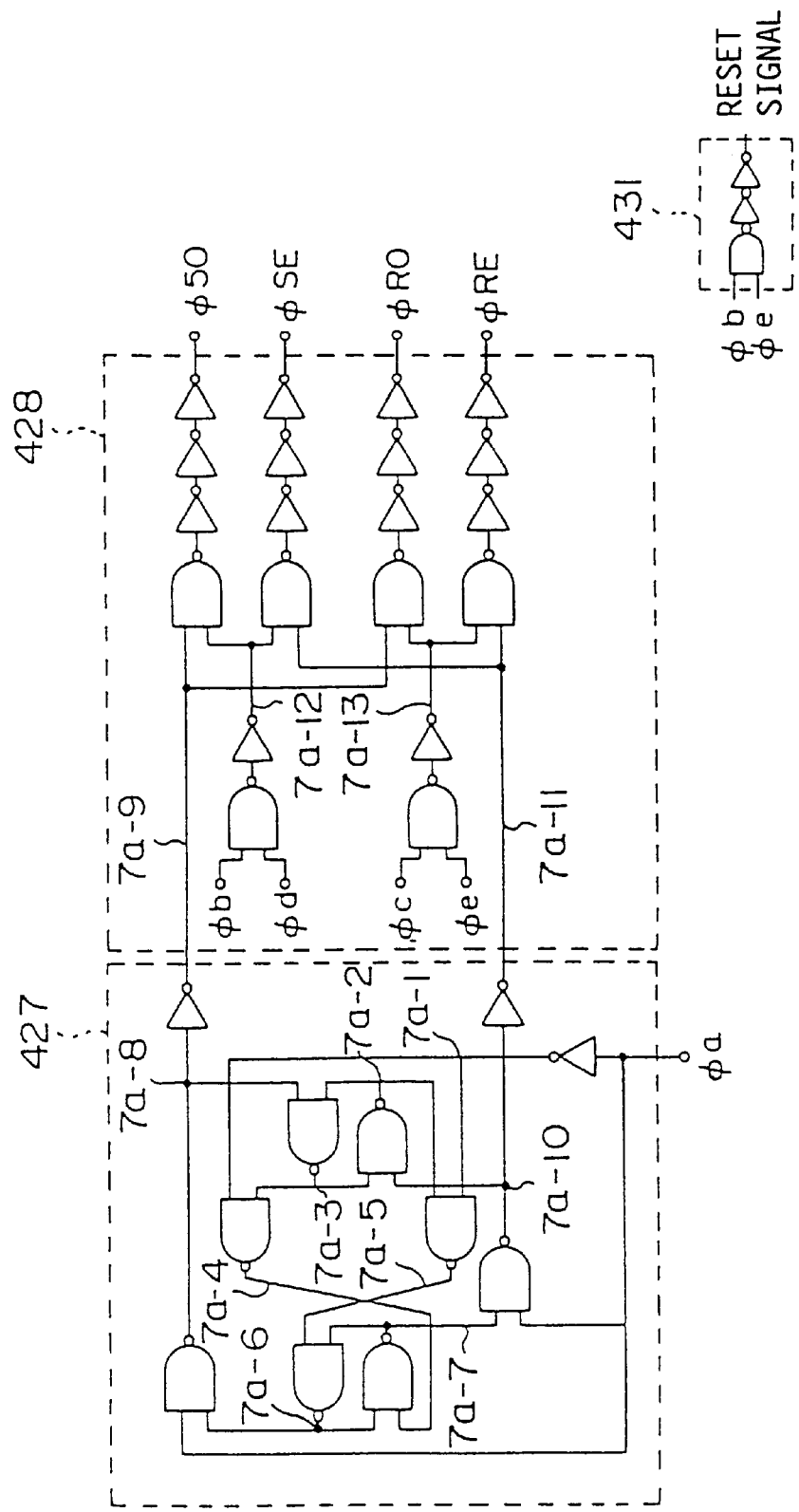
FIG. 18 is a circuit diagram of an amplifier circuit part of the phase comparator shown in FIG. 2.

Referring to FIG. 18, the amplifier part of the phase comparator circuit 31 includes a JK flip-flop 427, and an amplifier 428 made up of NAND gates and inverters. The JK flip-flop 427 is supplied with the output signal φa from the phase comparator part shown in FIG. 16. The potentials of nodes 7a-9 and 7a-11 depend on the output signal φa.

The amplifier 428 receives the two output signals of the JK flip-flop 427 and the output signals φb–φe, and generate the set signals φSE and φO and the reset signals φRE and φRO. The amplifier part shown in FIG. 18 also include a circuit 431, which produces the reset signal φR from the signals φb and φe. If the signal φout leads to or lags behind the signal φext over td, the reset signal φR is high. In the other cases, the reset signal φR is low.

Figure 19:
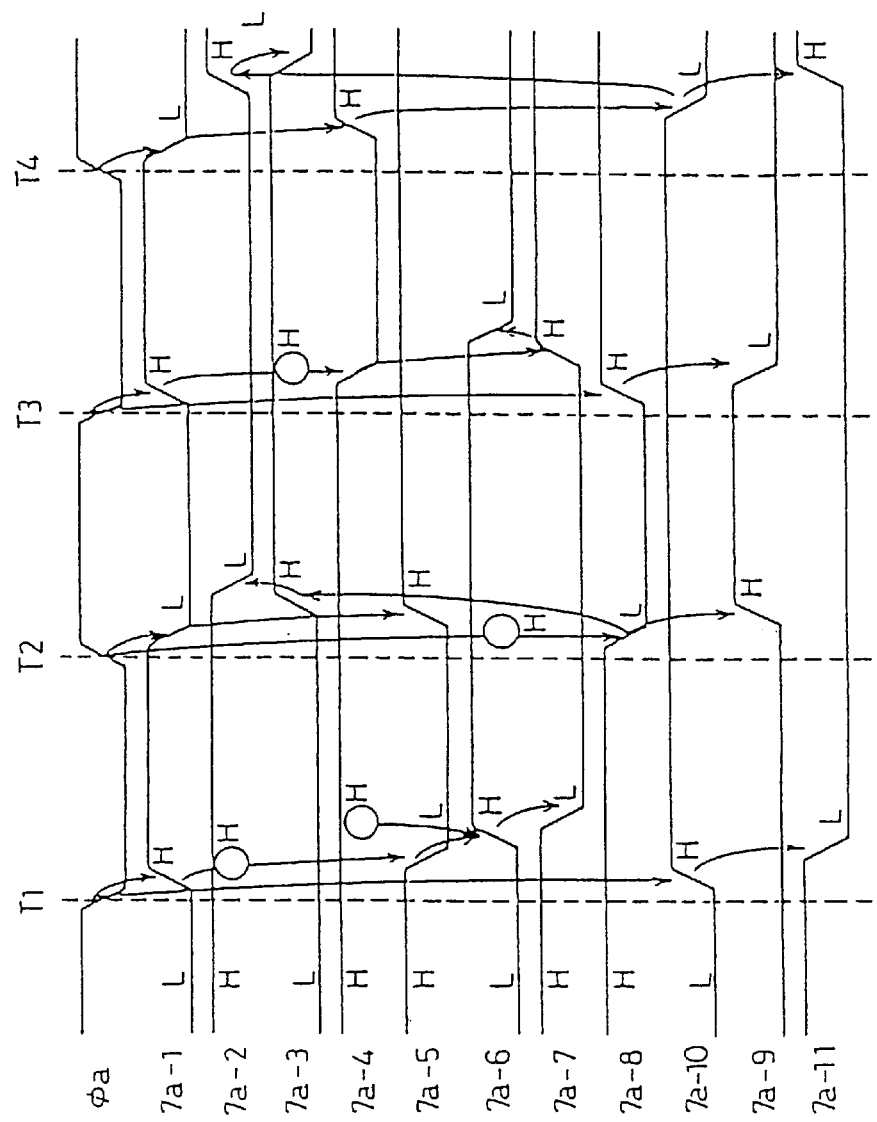
FIG. 19 is a timing chart of an operation of a JK flip-flop shown in FIG. 18.

The JK flip-flop 427 operates as shown in FIG. 19. When the signal φa is switched to the low level at time T1, the nodes 7a-1 and 7a-10 are switched to the high level. When the node 7a-1 is switched to the high level, the potentials of the nodes 7a-5, 7a-6 and 7a-7 are changed. However, the signal φa is low, and thus the potential of the node 7a-8 is not changed. Hence, the potential of the node (output) 8a-9 is not changed, only the node 7a-11 is changed from the low level to the high level. When the signal φa is changed from the low level to the high level at time T2, the node 7a-8 is changed from the high level to the low level, and the potential of the node 7a-10 is not changed because the potential of the node 7a-7 is not changed. The output node 7a-9 is changed from the low level to the high level, and the potential of the output node 7a-11 is not changed. In the above manner, the output nodes 7a-9 and 7a-11 the JK flip-flop circuit 427 are alternately switched to the high level and the low level in synchronism with the signal φa.

Figure 20:
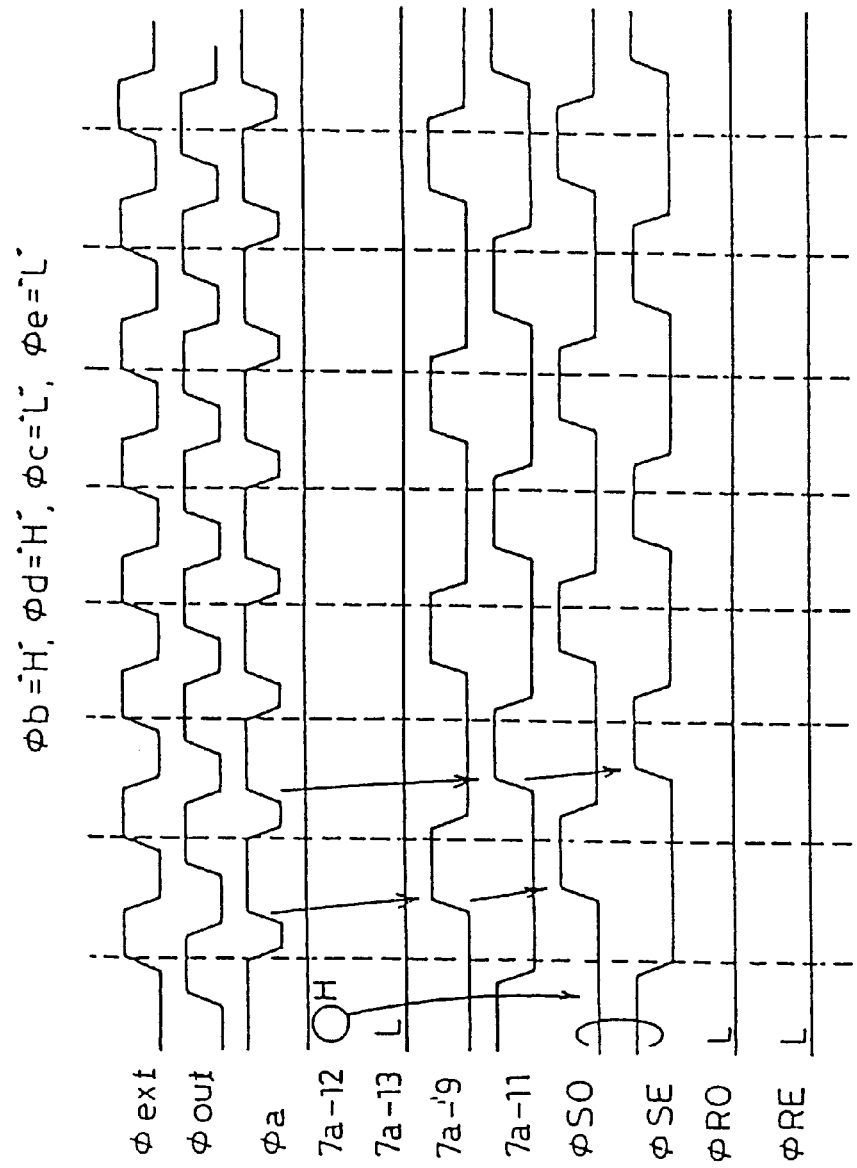
FIG. 20 is a timing chart of an operation of the amplifier circuit part shown in FIG. 18.
Figure 21:
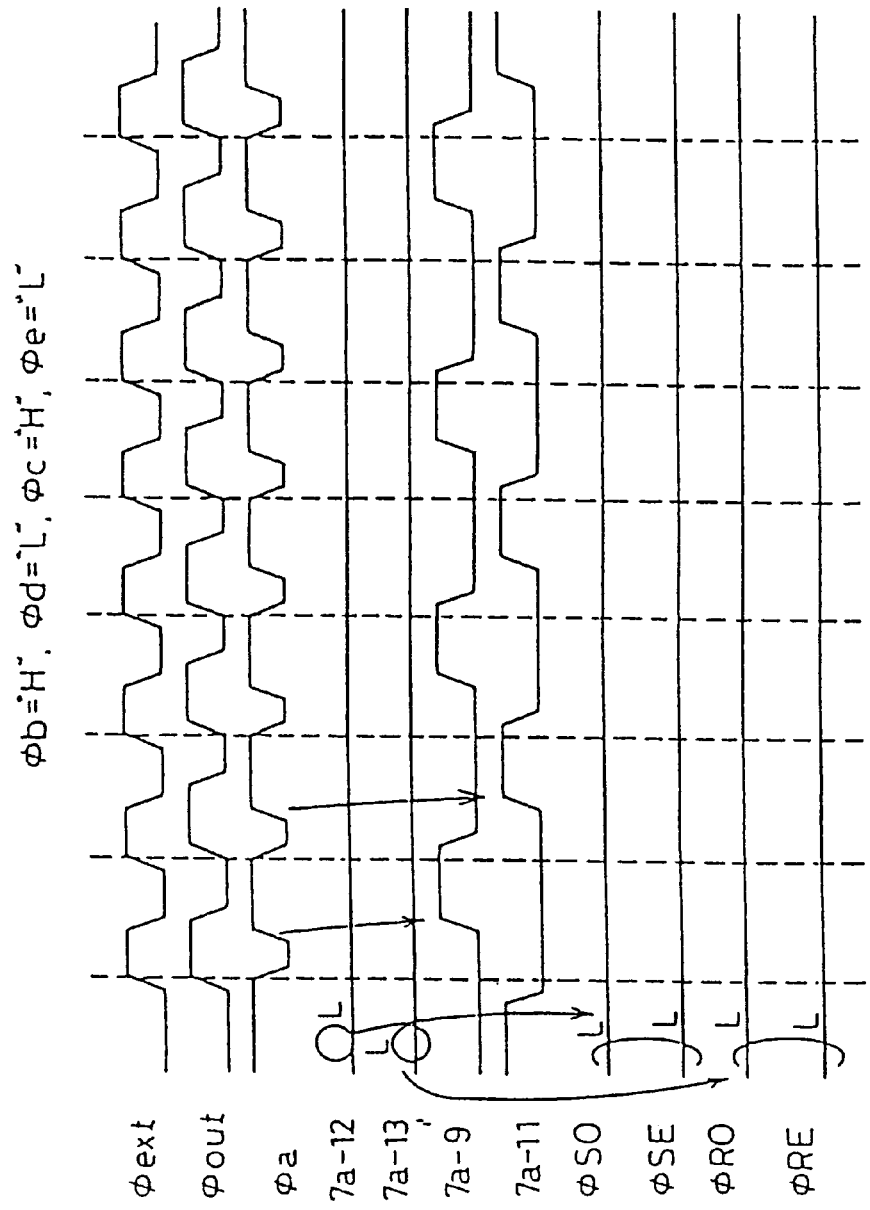
FIG. 21 is a timing chart of another operation of the amplifier circuit part shown in FIG. 18.
Figure 22:
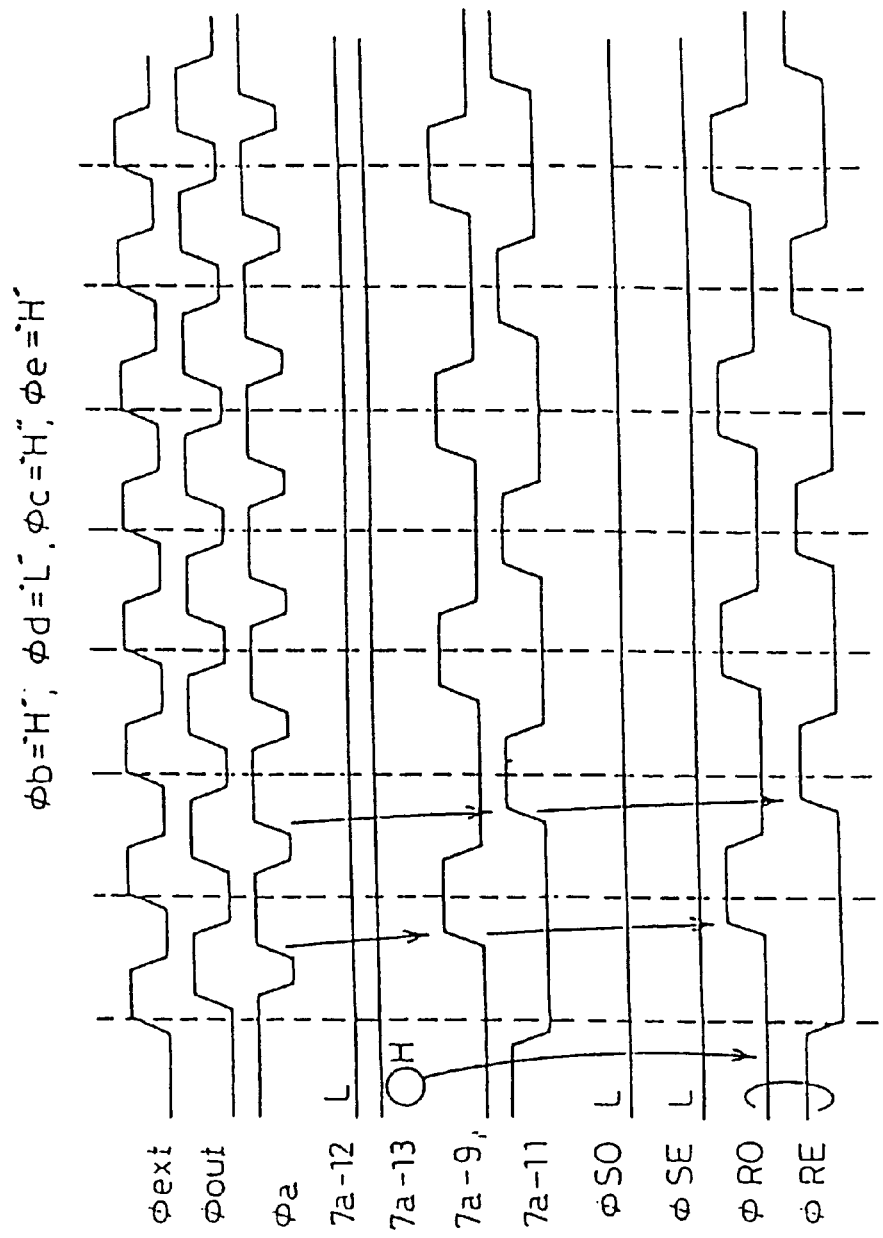
FIG. 22 is a timing chart of yet another operation of the amplifier circuit part shown in FIG. 18.

FIG. 20 is a timing chart of an operation of the aforementioned amplifier part 428 which should be performed when the count-up operation is required. FIG. 21 is a timing chart of an operation of the amplifier part 428 which should be performed which no count operation is required. FIG. 22 is a timing chart of an operation of the amplifier part 428 which should be performed when the count-down operation is required. A description will now be given, with reference to FIGS. 20 through 22, of the operations of the amplifier part 428.

FIG. 20 shows a case where the signal φout switches to the high level before the signal φext switches to the high level. In this case, the signals φb, φc, φd and φe applied to the amplifier part 428 are high, low, high and low, respectively. The node 7a-12 is switched to the high level and the node 7a-13 is fixed to the low level. The set signals φSO and φSE are changed in accordance with the JK flip-flop 427, while the reset signals φR0 and φRE are not changed because the potential of the node 7a-13 is low.

FIG. 21 shows a case where the signals φout and φext are switched to the high level at almost the same time. In this case, the signals φb, φc, φd and φe applied to the amplifier part 428 are low, high, high and low, respectively. The nodes 7a-12 and 7a-13 are fixed to the low level. Hence, the set signals φSE and φSO and the reset signals φRE and φRO are fixed to the low level.

FIG. 22 shows a case where the signal φout switches to the high level after the signal φext switches to the high level. In this case, the signals φb, φc, φd and φe applied to the amplifier part 428 are low, high, low and high, respectively. The node 7a-12 is fixed to the low level, and the node 7a-13 is fixed to the high level. Hence, the reset signals φRE and φRO are changed in accordance with the state of the JK flip-flop 427, while the set signals φSE and φSO are not changed because the node 7a-13 is low.

Figure 23:
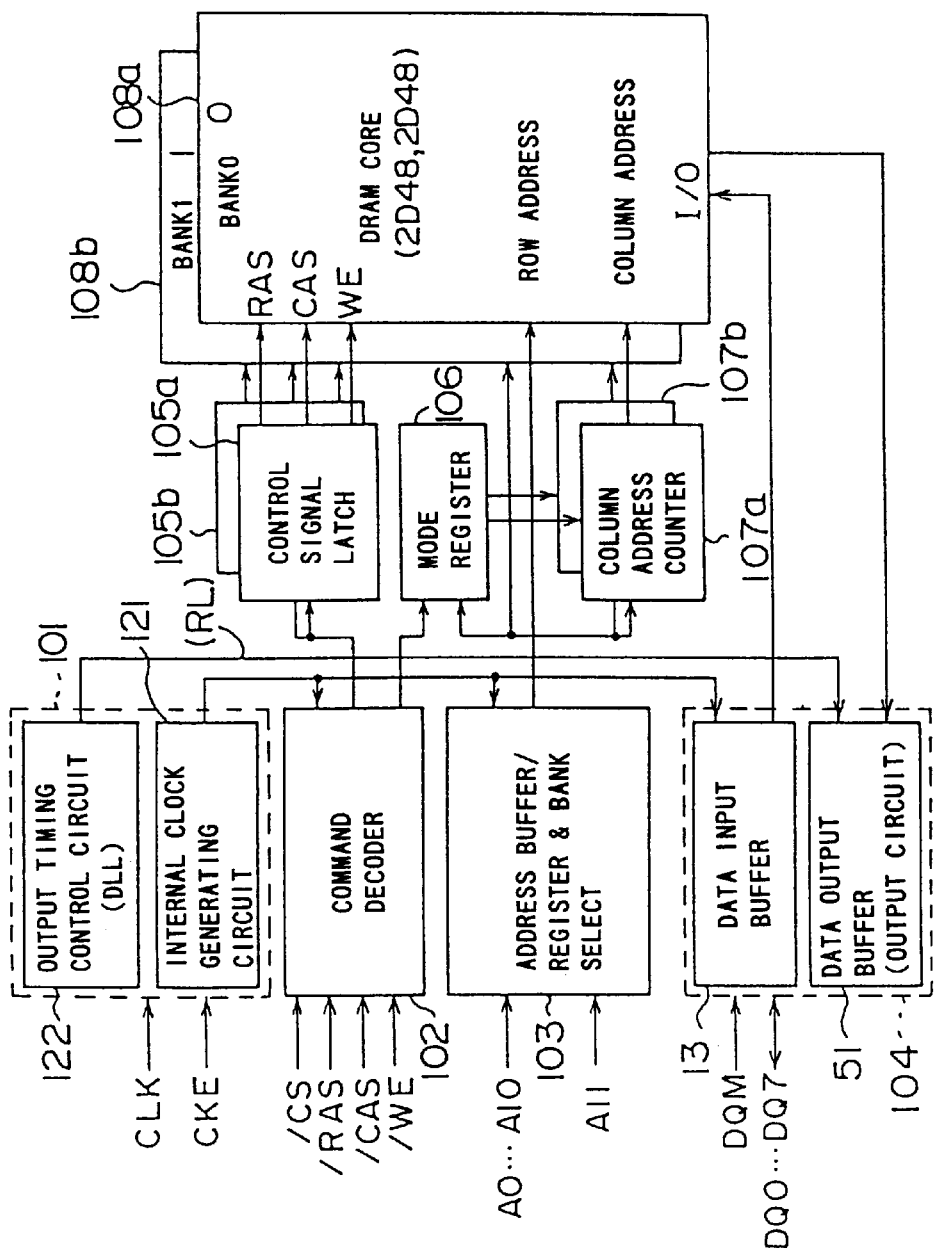
FIG. 23 is a block diagram of a synchronous DRAM which is an example of the semiconductor integrated circuit device according to the present invention.
Figure 24:
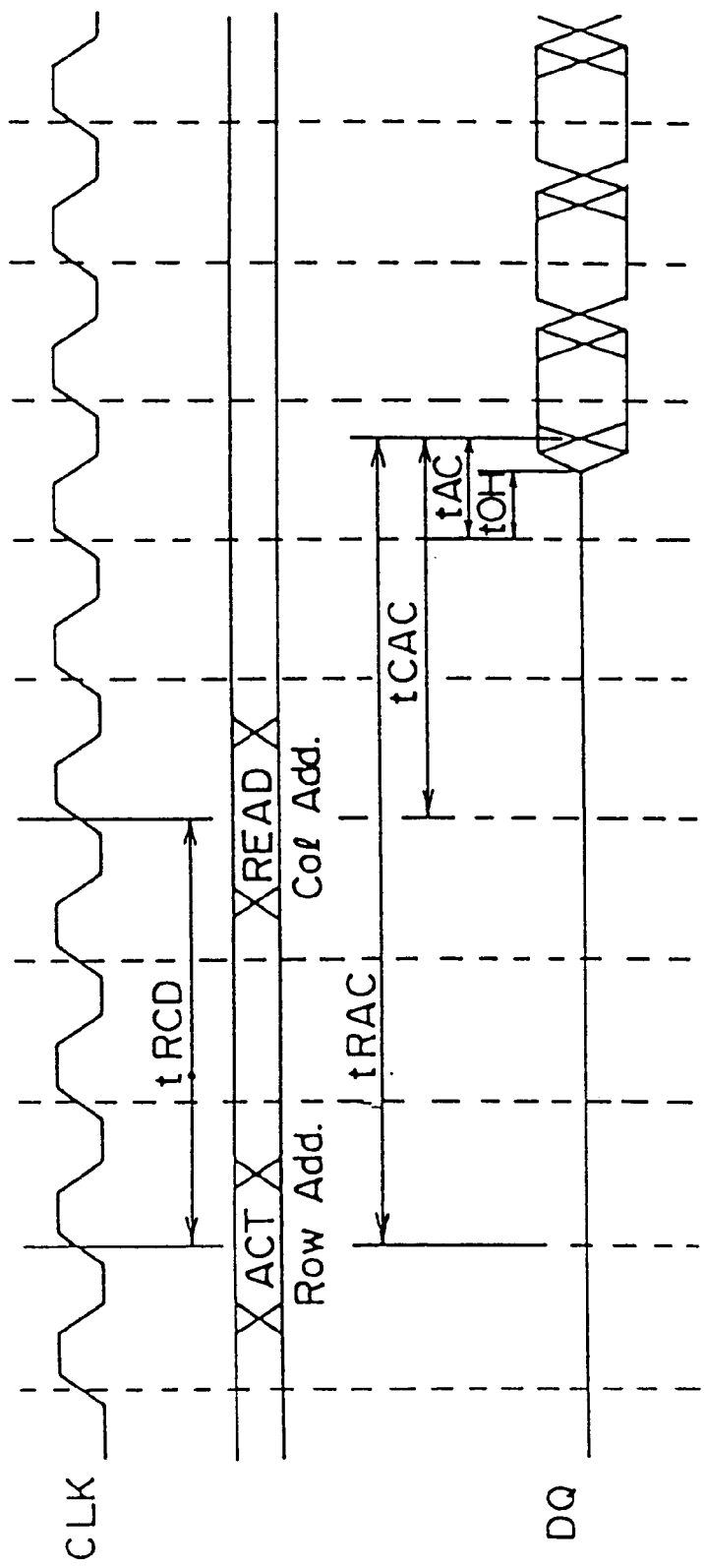
FIG. 24 is a timing chart of an operation of the SDRAM shown in FIG. 23.

FIG. 23 is a block diagram of an SDRAM device to which the above-mentioned digital DLL circuit device is applied. FIG. 24 is a timing chart of an operation of the SDRAM device shown in FIG. 23. A pipeline system is applied to the SDRAM device, which includes two banks #0 and #1 each having 16 Mbits and an eight-bit width.

As shown in FIG. 23, the SDRAM device includes DRAM cores 108a and 108b, a clock buffer 101, a command decoder 102, an address buffer/register and band address selector (address buffer) 103, an I/O data buffer/register 104, control signal latch circuits 105a and 105b, a mode register 106, and column address counters 107a and 107b. Various commands which define operation modes are defined by a chip select signal /CS, a row address strobe signal /RAS, a column address strobe signal /CAS and a write enable signal /WE. The commands are decoded by the command decoder 102, which controls the corresponding circuits on the basis of the decoded command. The signals /CS, /RAS, /CAS and /WE are applied to the control signal latch circuits 105a and 105b, which hold the states of these signals until the next command is applied.

The address signal is amplified by the address buffer 103, which outputs a row address signal applied to the banks #0 and #1. The row address signal is used as an initial value for the column address counters 107a and 107b.

The clock buffer 101 is equipped with an internal clock generating circuit 121 and an output timing control circuit 122. The internal clock generating circuit 121 generates an internal clock from an external clock CLK. The output timing control circuit 122 includes the aforementioned digital DLL circuit device and performs the fine delay control (phase control) so that the phase-controlled clock can be generated.

The I/O data buffer/register 104 is equipped with a data input buffer 13 and a data output buffer (output circuit) 51. Data read from either the DRAM core 108a or 108b is amplified to a given level by the data output buffer 51, and is output via data pads DQ0–DQ7 at the timing of the clock output by the output timing control circuit 122. Data externally applied to the data pads DQ0–DQ7 is applied to the DRAM cores 108a and 108b via the data input buffer 13. The clock line 41 corresponds to a line extending from the output timing control circuit 122 to the data output buffer 51.

The read operation of the above SDRAM device will be described with reference to FIG. 24.

The external clock CLK is supplied from a system in which the present SDRAM device is used. In synchronism with the rising edges of the external clock CLK, various commands, address signal and input data are latched and data is output.

When data is read from the DRAM device, an active command (ACT) defined by the signals /CS, /RAS, /CAS and /WE is applied, and a row address (Row add.) is applied. Hence, the SDRAM device is activated, and the word line corresponding to the row address is selected. Data stored in the cells connected to the selected word line is output to bit lines and is amplified by a sense amplifier.

After the operation time (tRCD) relating to the row address, a read command (READ) and the column address (Col Add.) are input. The data sensed by the sense amplifiers selected by the column address is output to a data bus line and is amplified by a data bus amplifier. Further, the data amplified by the data bus amplifier is amplified by the output buffer 51 and is then output to the data pads DQ. The above operation is the same as that of the general-purpose DRAM device. However, in the SDRAM device, the circuits relating to the column address are designed to perform the pipeline operation, in which read data can be obtained every cycle. Hence, the data output operation has the cycle of the external clock CLK.

Generally, there are three different access times, all of which are defined with respect to the rising edges of the external clock CLK. In FIG. 24, tRAC denotes a row address access time, tCAC is a column address access time, and tAC denotes a clock access time.

Figure 25:
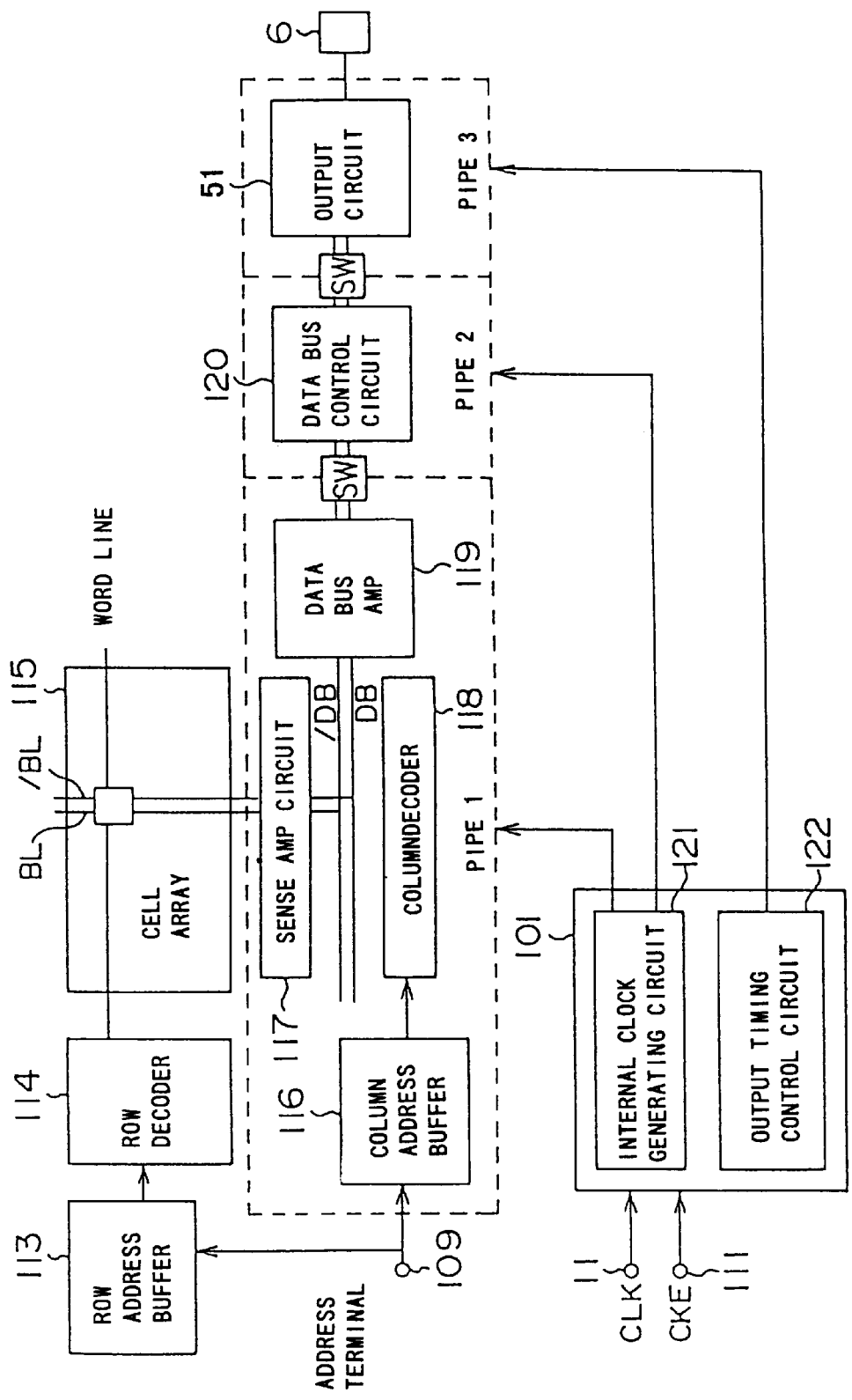
FIG. 25 is a block diagram of a part of the SDRAM shown in FIG. 23.

FIG. 25 is a block diagram of a part of the SDRAM device shown in FIG. 23, which part relates to the pipeline operation. The configuration shown in FIG. 25 has three stages of the pipeline.

The circuit part relating to the column address is segmented into parts in accordance with the flow of the pipeline process. The segmented parts are called pipes.

As has been described with respect to FIG. 23, the clock buffer 101 is equipped with the internal clock generating circuit 121 and the output timing control circuit 122. The output signal of the internal clock generating circuit 121 is supplied to pipes #1 and #2. The output signal (the phase controlled internal clock) of the output timing control circuit 122 is supplied to the output circuit 51 (data output buffer) of pipe #3.

The pipes #1, #2 and #3 are controlled in accordance with the respective clocks supplied thereto. Switches SW are provided between the adjacent pipes, and control the signal transfer timings. The switches SW are controlled by the clock generated by the internal clock generating circuit 121 of the clock buffer 101.

In the pipe #1, the address signal is amplified by the column address buffer 116 and is then applied to the column decoder 118. Then, the column decoder 118 selects sense amplifiers in a sense amplifier circuit 117 in accordance with the decoded column address. In FIG. 25, only one pair of bit lines BL and /BL extending in a cell array 115 and only one pair of data bus lines DB and /DB are illustrated for the sake of simplicity. Data sensed by the selected sense amplifier is transferred to the data bus lines DB and /DB, and is then amplified by a data bus amplifier 119.

The pipe #2 includes a data bus control circuit 120, and the pipe #3 includes the output buffer 51 of the I/O buffer 104. In FIG. 25, the data input buffer 13 of the I/O buffer 104 is omitted for the sake of simplicity.

When the pipes #1, #2 and #3 complete the respective operations within the respective clock cycles, data can be transferred in a relay formation by opening and closing the switches SW in synchronism with the clock applied thereto. Hence, the processes in the pipes #1, #2 and #3 can be carried out in parallel, and data can be continuously output to the data output terminal 6 in synchronism with the phase-controlled clock.

Figure 26:
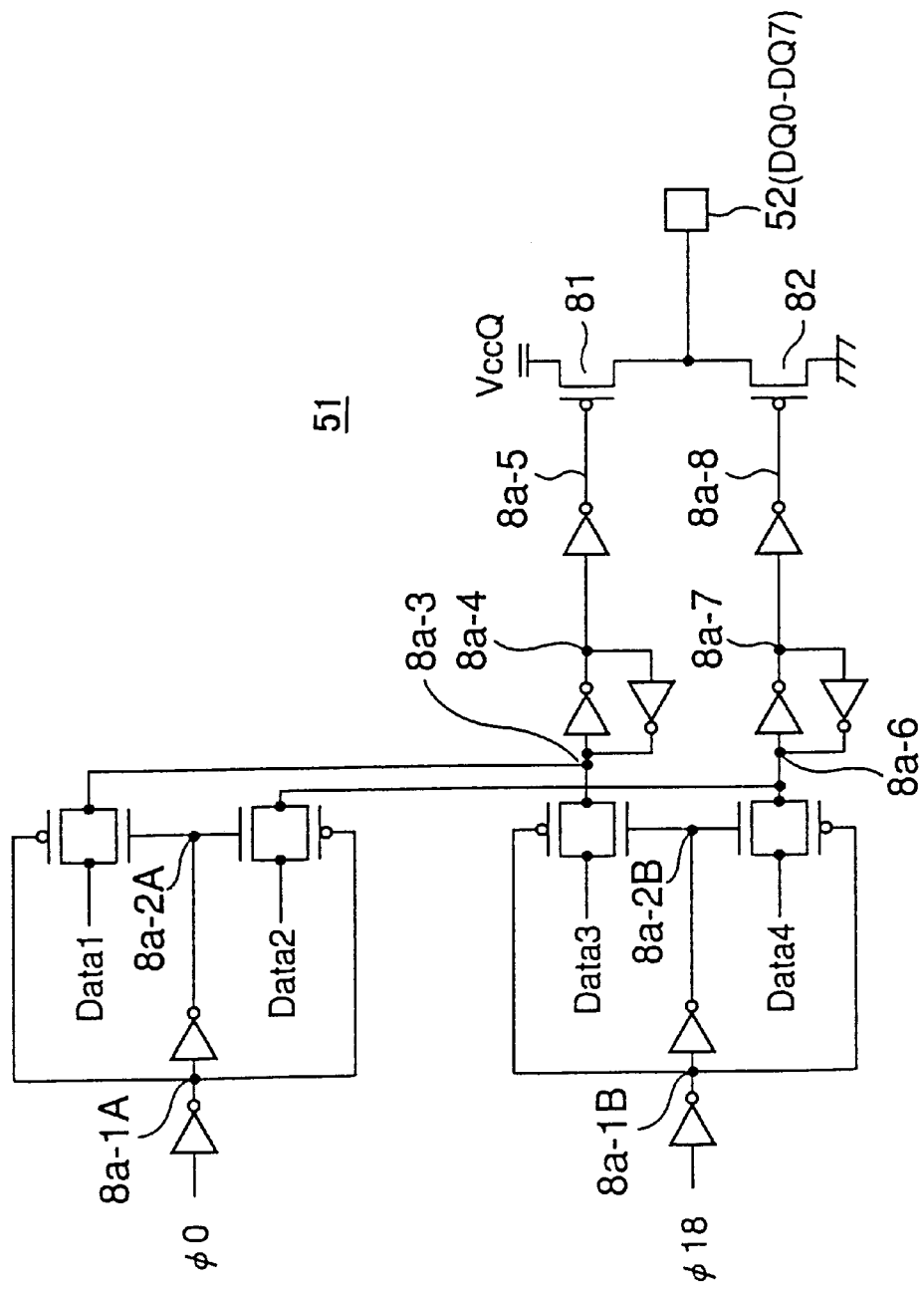
FIG. 26 is a block diagram an output circuit shown in FIG. 2.

FIG. 26 is a diagram of a configuration of the output circuit (data output buffer) 51 employed in the semiconductor integrated circuit device according to the present invention. As shown in FIGS. 25 and 26, Data 1 and Data2 shown in FIG. 26 are read from the cell array 115, and are transferred via the sense amplifier circuit 117, the data bus amplifier 119 and the data bus control circuit 120. The output signals of the data bus control circuit 120 thus obtained correspond to data stored in the memory cell array 115. When the data stored in the memory cell array 115 is H (high-level data), the signals Data1 and Data2 are both L. When the data stored in the memory cell array 115 is L (low-level data), the signals Data1 and Data2 are both H. A high-impedance state in which the output data is neither H nor L) is available. In this case, the signal Data1 is set to H and the signal Data2 is set to L. Data3 and Data4 are read from the memory cell array 115, and are transferred via the sense amplifier 117, the data bus amplifier 119 and the data bus control circuit 120 in the same manner as Data1 and Data2. The signals Data3 and Data4 are both L when the output data read from the memory cell array 115 is H, and are both H when the output data is L.

A signal $\phi 0$ corresponds to an output signal (real clock) of the output timing control circuit 122 (the delay circuit 42 shown in FIG. 2), and functions as an enable signal of the output circuit 51. When the clock $\phi 0$ rises and becomes H, information on Data1 and Data2 appears on a data output pad 52 (DQ0–DQ7). For example, it is now supposed that the high-level data is output to the data output pad 52. The clock $\phi 0$ rises from L to H. A node 8a-1A is switched to L and a node 8a-2A is switched to H. Thus, the associated transfer gates are turned ON, and the signals Data1 and Data2 are transmitted to nodes 8a-3 and 8a-6. Thus, a node 8a-5 is switched to L, and a node 8a-8 is switched to H. Hence, a P-channel transistor 81 is turned ON, while an N-channel transistor 82 is turned OFF. As a result, the high-level data is available at the data output pad 52. When the clock $\phi 0$ becomes L, the transfer gates are turned OFF, and the current output state is retained.

A signal $\phi 18$ corresponds to another output signal (inverted real clock) of the output timing control circuit 122 (delay circuit 41 shown in FIG. 2), and functions as another output enable signal of the output circuit 51. There is a 180-degree phase difference between the signal $\phi 0$ and the signal $\phi 18$.

When the clock $\phi 18$ rises and becomes H, information on Data3 and Data4 appear on the data output pad 52 (DQ0–DQ7). For example, it is now supposed that the high-level data is output to the data output pad 52. The clock $\phi 18$ rises from L to H. A node 8a-1B is switched to L and a node 8a-2B is switched to H. Thus, the associated transfer gates are turned ON, and the signals Data3 and Data4 are transmitted to the nodes 8a-3 and 8a-6. Thus, the node 8a-5 is switched to L, and the node 8a-8 is switched to H. Hence, the P-channel transistor 81 is turned ON, while the N-channel transistor 82 is turned OFF. As a result, the high-level data is available at the data output pad 52. When the clock $\phi 18$ becomes L, the transfer gates are turned OFF, and the current output state is retained.

In short, information on Data1 and Data2 is latched at the time of rising of the clock $\phi 0$ and is output via the data output pad 52. Next, information on Data3 and Data4 is latched at the time of rising of the clock $\phi 18$ and is output via the data output pad 52. The above output operations are alternately performed.

Figure 27:
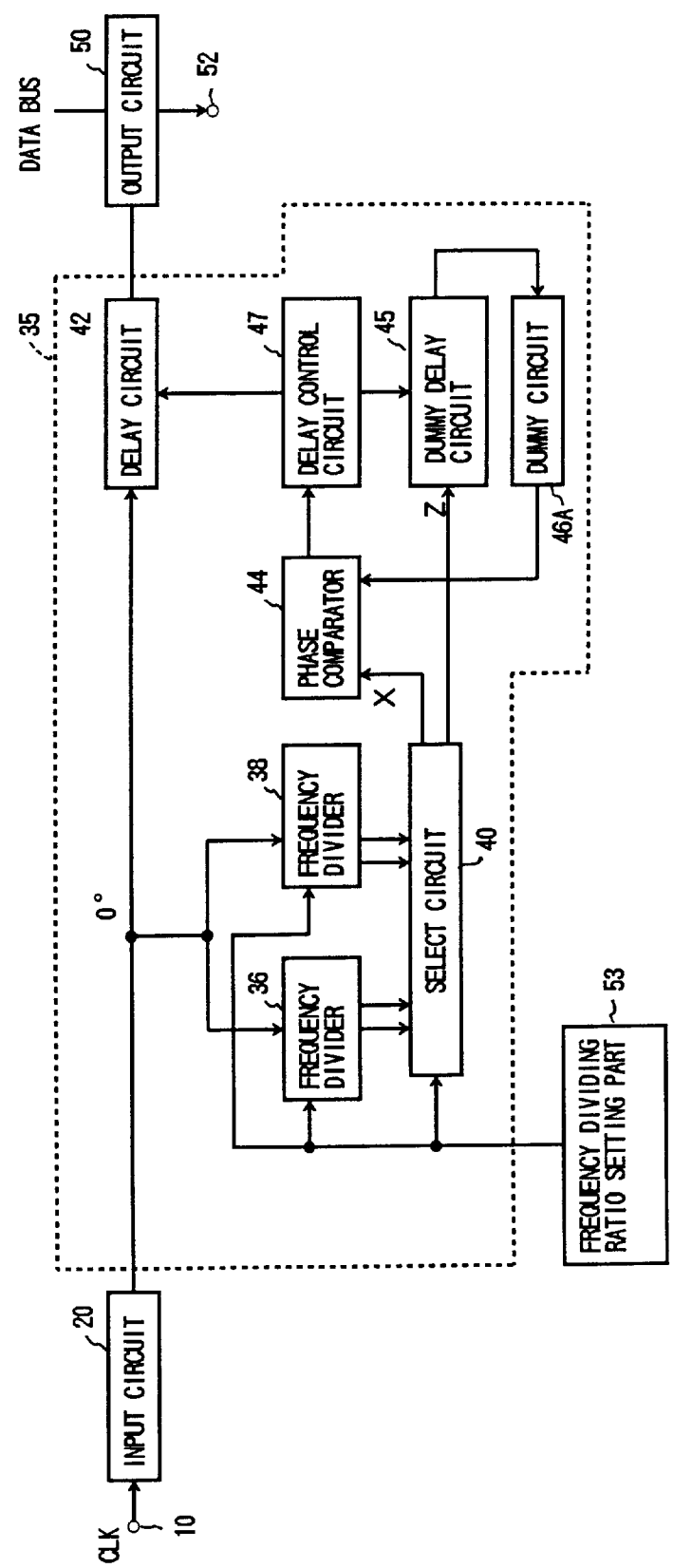
FIG. 27 is a block diagram of a semiconductor integrated circuit device according to a second embodiment of the present invention.

FIG. 27 is a block diagram of a semiconductor integrated circuit device according to a second embodiment of the present invention. The configuration shown in FIG. 27 can be obtained by modifying the configuration shown in FIG. 2 so that the 1/2 frequency divider 30 and the selector circuit 32 are deleted from FIG. 2 and the delay circuit 41 in the 0-degree DLL block 35 is deleted therefrom, while a frequency dividing ratio setting part 53 and a dummy circuit 46A are provided rather than the mode register 34 and the dummy circuit 46, respectively. In FIG. 27, parts that are the same as those shown in FIG. 2 are given the same reference numbers.

Referring to FIG. 27, the external clock CLK applied to the clock input pad 10 passes through the input circuit 20 functioning as a buffer, and is then supplied to the frequency dividers 36 and 38 and the delay circuit 42 of the 0-degree DLL block 35.

The frequency divider 36 frequency-divides the external clock with a ratio of 1/4 and results in a dummy clock Z and a reference clock X. The dummy clock Z is at the high level H during the period equal to one cycle of the clock supplied, and is at the low level L during the period equal to three cycles of the clock. The reference clock X is the inverted signal of the dummy clock Z. Thus, the reference clock X is at the low level L during the period equal to one cycle of the clock supplied, and is at the high level H during the period equal to three cycles thereof. The dummy clock Z and the reference clock X are supplied to the selector circuit 40.

When a frequency dividing ratio setting signal supplied from the frequency dividing ratio setting part 53 indicates a low frequency dividing ratio, the dummy clock Z and the reference clock X output by the frequency divider 36 are selected. On the other hand, when the frequency dividing ratio setting signal indicates a high frequency dividing ratio, the dummy clock Z and the reference clock X output by the frequency divider 38 are selected. The reference clock X thus selected is supplied to the phase comparator 44. The selected dummy clock Z passes through the dummy delay circuit 45 and the dummy circuit 46A, and is then supplied to the phase comparator 44.

The dummy circuit 46A has the same circuit configuration as the input circuit 20 and has the same delay amount as that of the input circuit 20. The phase comparator 44 compares the phase of the delayed dummy clock dZ from the dummy circuit 46A with the phase of the reference clock X from the phase comparator 44, and results in the phase difference signal, which is supplied to the delay control circuit 47. The delay control circuit 47 controls, on the basis of the phase difference signal, the delay amount of the dummy delay circuit 45 so that the phase difference becomes zero. Thus, the delay amount of the dummy delay circuit 45 is controlled so that the rising edge of the dummy clock Z coincides with the rising edge of the reference clock X, that is, the delayed dummy clock Z lags behind the reference clock X by a delay of time equal to k cycles of the external clock.

The delay circuit 41 supplied with the inverted frequency-divided clock and the dummy delay circuit 42 supplied with the frequency-divided clock have the same configuration as the dummy delay circuit 45, and are controlled, by the delay control circuit 47, to have the same delay amounts as that of the dummy delay circuit 45. The frequency-divided clock (0-degree clock) delayed by 360 degrees by the delay circuit 42 is supplied, as the real clock, to the output circuit 50, and the frequency-divided clock (180-degree clock) delayed by 180 degrees by the delay circuit 41 is supplied, as the inverted real clock, to the output circuit 50. The output circuit 50 buffers data on the data bus in synchronism with the real clock and the inverted real clock, and outputs buffered data via a data output pad 52. That is, the data output from the output circuit 50 is synchronized with the input clock externally supplied via the clock input pad 10.

Even in the second embodiment of the present invention, the delay amount of the reference clock can be varied by changing the frequency dividing ratio in accordance with the frequency of the input clock. Hence, it is possible to prevent occurrence of an underflow by increasing the delay amount of the reference clock and to prevent occurrence of an overflow by reducing the delay amount of the reference clock.

The frequency dividing ratio setting part 53 can be implemented by various methods using a frequency dividing ratio setting storage means. For example, the user writes data indicative of the frequency dividing ratio into the mode register 34. Second, fuses are provided on the chip of the semiconductor integrated circuit device. The fuses are selectively cut by a laser beam at the time of a wafer test in accordance with the frequency dividing ratio to be set. Third, a mask option in the wafer process is utilized in which the frequency dividing ratio is set by the master-slice process. Fourth, a bonding option in the assembly process is utilized. Alternatively, an automatic clock cycle detection circuit may be used to automatically detect the clock cycle after power on and automatically set the frequency dividing ratio from the detected clock cycle.

Figure 29:
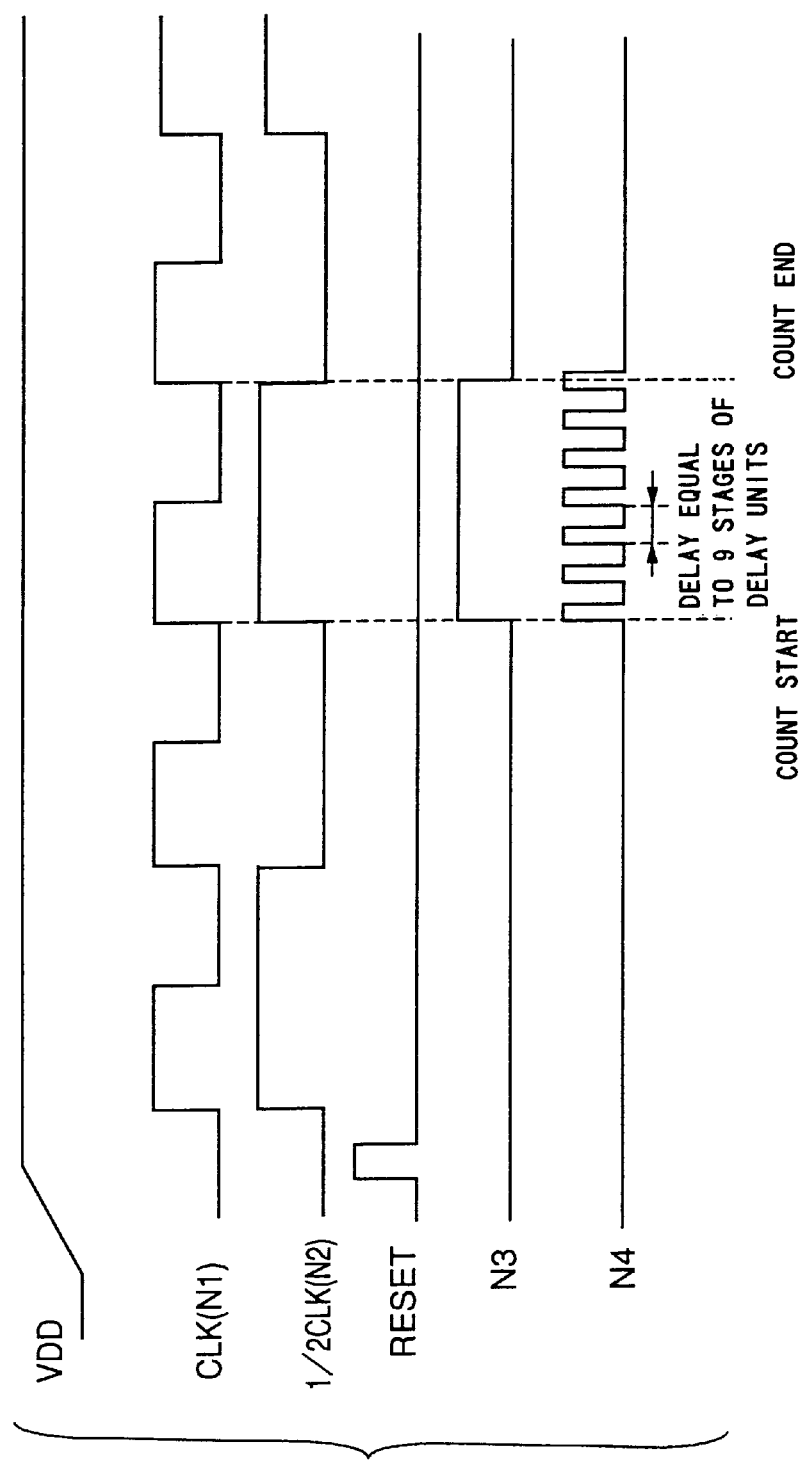
FIG. 29 is a timing chart of the automatic clock cycle detection circuit shown in FIG. 28.

A description will be given of an automatic clock cycle detection circuit as described above by referring to FIGS. 28A–28C and 29. FIG. 28A is a block diagram of a configuration of an automatic clock cycle detection circuit 530, and FIG. 28B shows a configuration of delay units shown in FIG. 28A. FIG. 28C shows an oscillation signal, and FIG. 29 is a timing chart of an operation of the automatic clock cycle detection circuit 530.

A power-on reset circuit RESET shown in FIG. 28A is maintained at the high level H during a given period at the time of setting up the circuit after a power supply voltage VDD (FIG. 28B) is settled. The power-on reset circuit RESET is supplied to a one-shot clock generator 532 and a binary counter 541 provided in the automatic clock cycle detection circuit 530. The external clock CLK(N1) is the subject of the automatic clock detection, and is supplied after the power-on reset signal RESET rises to the high level. The external clock CLK is supplied to a 1/2 frequency divider 531.

The 1/2 frequency divider 531 frequency-divides the external clock CLK(N1) at a frequency dividing ratio of 1/2. A frequency-divided clock N2 thus obtained is supplied to the one-shot clock generator 532. After the one-shot clock generator 532 is reset by the reset signal RESET, the generator 532 extracts the second pulse of the clock N2 and thus generates a one-shot clock N3 having a high-level period equal to one cycle of the external clock CLK(N1). The one-short clock N3 thus generated is supplied to a NAND gate 534 via an inverter 533.

The NAND gate 534 is supplied with an output signal of a NAND gate 539, which is supplied with the output signal of the NAND gate 534. The output signal of the NAND gate 539 is supplied to a delay unit 535. Delay units 535–538 are cascaded, and the output signal of the delay unit 538 is supplied to the NAND gate 539. The NAND gate 539 and the delay units 535–538 constitutes a ring oscillator when the one-shot clock N3 is at the high level H.

As shown in FIG. 28B, each of the delay units 535–538 is made up of a NAND gate 535a and an inverter 535b, and has a delay amount equal to two stages of NAND gate 539. Hence, the oscillation signal generated by the ring oscillator has one period τ equal to a delay time of nine stages of delay units. The output signal of the NAND gate 539 passes through an inverter 540 and is supplied, as an oscillation signal N4, to the binary counter 540. Then, the binary counter 540 counts the oscillation signal and supplies a frequency dividing ratio setting signal generator 542 with a count value of, for example, four bits.

When the four-bit count value exceeds over 7 and the most significant bit thereof is 1, the frequency dividing ratio setting signal generator 542 determines that the frequency of the external clock CLK(N1) is low and outputs the frequency dividing ratio setting signal indicating a low frequency dividing ratio. On the other hand, when the four-bit count value is equal to or smaller than 7 and the most significant bit thereof is 0, the frequency dividing ratio setting signal generator 542 determines that the frequency of the external clock CLK(N1) is high and outputs the frequency dividing ratio setting signal indicating a high frequency dividing ratio.

As described above, the frequency dividing ratio setting signal is generated by detecting the frequency of the input clock. Thus, even if the frequency of the input clock is varied, it is possible to set the frequency dividing ratio of the frequency dividing means to an appropriate value.

Figure 30:
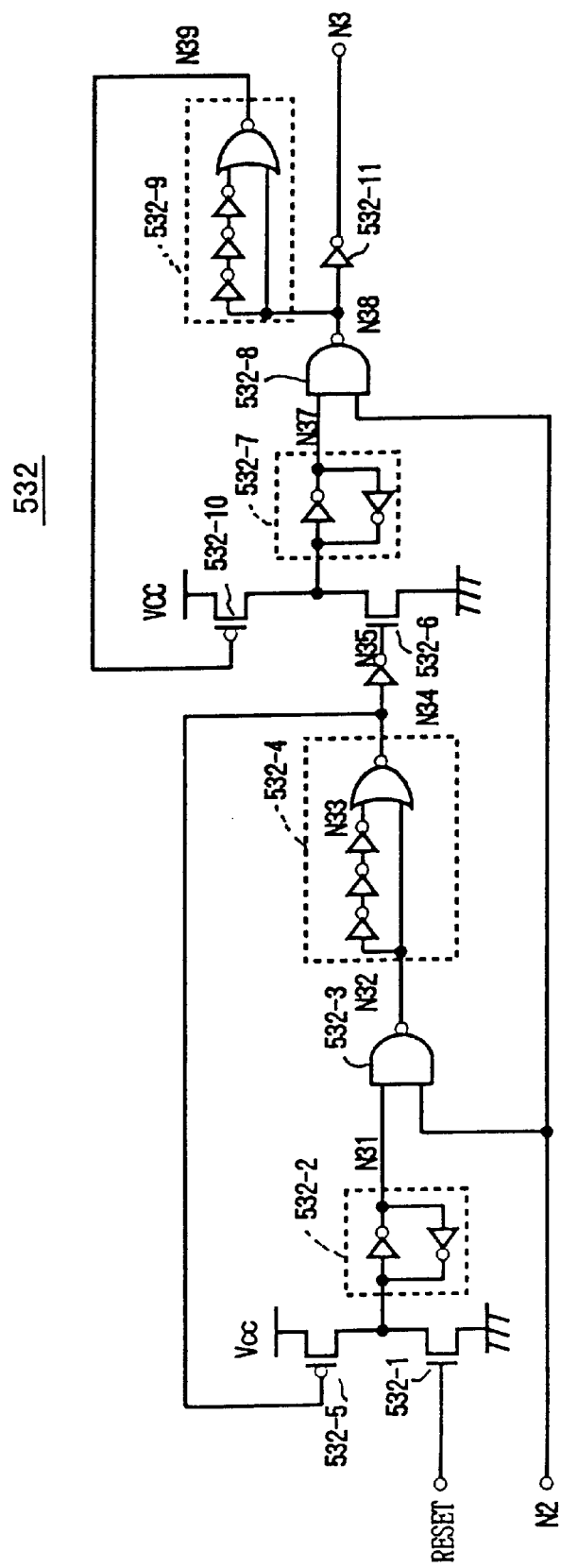
FIG. 30 is a circuit diagram of a one-shot clock generator shown in FIG. 28A.
Figure 31:
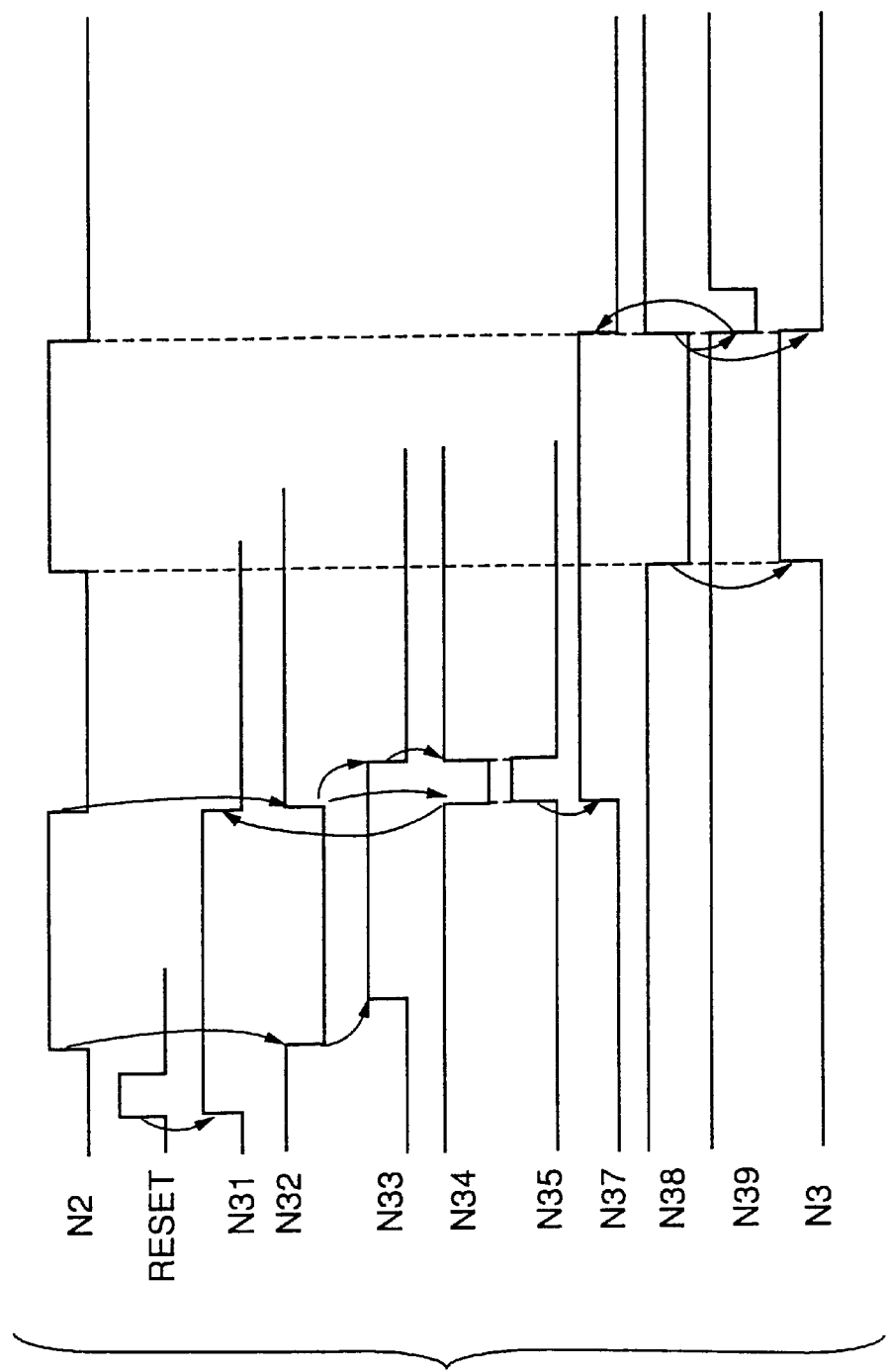
FIG. 31 is a timing chart of an operation of the one-shot clock generator shown in FIG. 30.

FIG. 30 is a circuit diagram of the one-shot clock generator 532, and FIG. 31 is a timing chart of an operation thereof.

Referring to FIG. 30, the power-on reset signal RESET is supplied to a transistor 532-1, and a latch circuit 532-2 of the first stage is set. A signal N31 output by the latch circuit 532-2 rises, as shown in FIG. 31. Thus, a NAND gate 532-3 outputs a signal N32, which is the inverted signal of the first pulse of the clock N2. A rising detection circuit 532-4 detects the rising of the signal N32, and thus generates a pulse N34 of a negative polarity having a given width. The pulse N34 is supplied to a transistor 532-5, and the latch circuit 532-2 of the first stage is reset. Further, the pulse N34 is inverted by an inverter and is then applied to a transistor 532-6. Hence, a latch circuit 532-7 of the second stage is set.

A signal N37 output by the latch circuit 532-7 rises, as shown in FIG. 31. Then, a NAND gate 532-8 outputs a signal N38, which is the inverted signal of the second pulse of the clock N2. A rising detection circuit 532-9 detects the rising edge of the signal N38, and generates a pulse N39 of a negative polarity having a given width. The pulse N39 is supplied to a transistor 532-10, and the latch circuit 532-7 of the second stage is reset. The pulse N39 is inverted by an inverter 532-11, and the one-shot clock N3 obtained by extracting the second pulse of the clock N2 is generated and output. The arrangement in which the second pulse of the clock N2 is extracted is employed taking into account the stability of the external clock.

Figure 32:
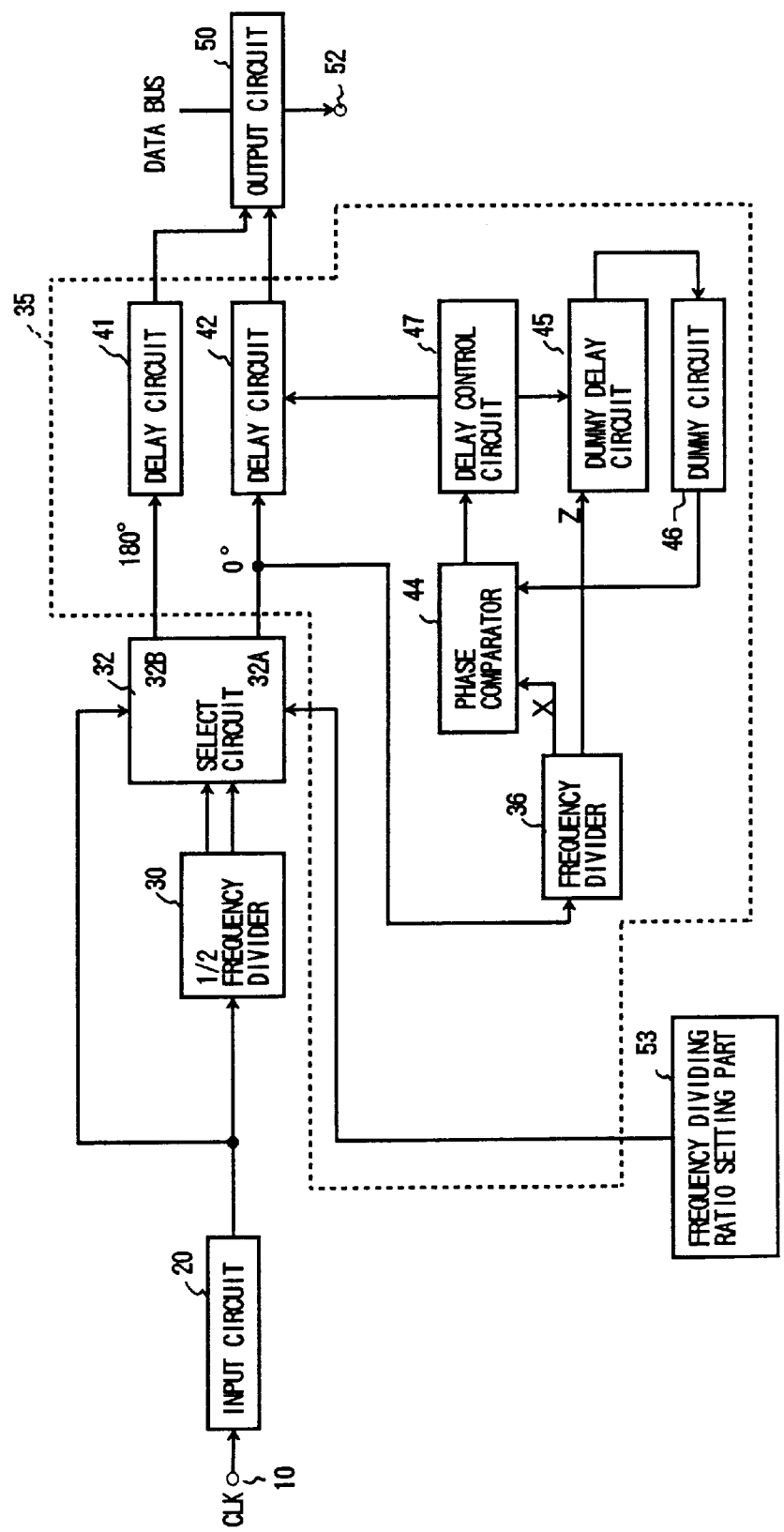
FIG. 32 is a block diagram of a semiconductor integrated circuit device according to a third embodiment of the present invention.

FIG. 32 is a block diagram of a semiconductor integrated circuit device according to a third embodiment of the present invention. The configuration shown in FIG. 32 is obtained by deleting the frequency divider 38 and the selector circuit 40 from the first embodiment shown in FIG. 2, and adding the frequency dividing ratio setting part 53 rather than the mode register 34. In FIG. 32, parts that are the same as those shown in FIG. 2 are given the same reference numbers.

The external clock CLK applied to the clock input pad 10 passes through the input circuit 20 functioning as a buffer, and is then supplied to the 1/2 frequency divider 30 and the selector circuit 32. The 1/2 frequency divider 30 divides the frequency of the external clock into two (that is, at a frequency dividing ratio of 1/2). Hence, the frequency-divided clock (0 degree) and the inverted frequency-divided clock (180 degrees) are generated and supplied to the selector circuit 32.

The selector circuit 32 has the configuration shown in FIG. 3, and is made up of the transfer gates 55, 56 and 57 and the inverter 58.

In the present case, the frequency dividing ratio setting signal is at the high level H when the external clock CLK has a low frequency and the frequency dividing ratio setting signal indicates a low frequency dividing ratio. When the frequency dividing ratio setting signal is at the high level H, the transfer gate 55 is ON and the transfer gates 56 and 57 are OFF. Thus, the external clock which passes through the transfer gate 55 from the input circuit 20 is output via the terminal 32A of the selector circuit 32 to the 0-degree DLL block 35. At that time, no signal is output via the terminal 32B.

When the frequency dividing ratio setting signal is at the low level L, the transfer gates 56 and 57 are ON and the transfer gate 55 is OFF. Thus, the frequency-divided clock and the inverted frequency-divided clock passing through the transfer gates 56 and 57 are supplied to the 0-degree DLL block 35 via the terminals 32A and 32B of the selector circuit 32, respectively.

The signal output via the terminal 32A of the selector circuit 32 is supplied to the frequency divider 36 and the delay circuit 42 of the 0-degree DLL block, and the signal via the terminal 32B (which is the inverted frequency-divided clock when DL=L and no signal is output when DL=H) is supplied to the delay circuit 41.

The frequency divider 36 frequency-divides the frequency-divided clock or the inverted version thereof at a frequency dividing ratio of, for example, 1/4, and thus results in the dummy clock Z and the reference clock X. The dummy clock Z is at the high level H during the period equal to one cycle of the clock supplied to the frequency divider 36, and is at the low level L during the period equal to three cycles of the clock. The reference clock X is at the low level L during the period equal to one cycle of the clock, and is at the high level H during the period equal to three cycles thereof. The reference clock X is supplied to the phase comparator 44. The dummy clock Z is transferred via the dummy delay circuit 45 and the dummy circuit 46, and is supplied to the phase comparator 44.

The dummy circuit 46 has the same configurations as those of the input circuit 20, the 1/2 frequency divider 30 and the output circuit 50, and has the same delay amounts as those thereof. The phase comparator 44 compares the phase of the delayed dummy clock dZ from the dummy circuit 46 with the phase of the reference clock X from the phase comparator 46, and results in the phase difference signal, which is supplied to the delay control circuit 47. The delay control circuit 47 controls, on the basis of the phase difference signal, a delay amount of the dummy delay circuit 45 so that the phase difference becomes zero. Thus, the delay amount of the dummy delay circuit 45 is controlled so that the rising edge of the dummy clock Z coincides with the rising edge of the reference clock X, that is, the delayed dummy clock Z lags behind the reference clock X by a delay of time equal to k cycles of the external clock.

The delay circuit 41 supplied with the inverted frequency-divided clock and the dummy delay circuit 42 supplied with the frequency-divided clock have the same configuration as the dummy delay circuit 45, and are controlled, by the delay control circuit 47, to have the same delay amounts as that of the dummy delay circuit 45. The frequency-divided clock (0-degree clock) delayed by 360 degrees by the delay circuit 42 is supplied, as the real clock, to the output circuit 50, and the frequency-divided clock (180-degree clock) delayed by 180 degrees by the delay circuit 41 is supplied, as the inverted real clock, to the output circuit 50. The output circuit 50 buffers data on the data bus in synchronism with the real clock and the inverted real clock, and outputs buffered data via a data output pad 52. That is, the data output from the output circuit 50 is synchronized with the input clock externally supplied via the clock input pad 10.

The selector circuit 32 selects the external clock which has not been subjected to the 1/2 frequency dividing process and outputs it, via the terminal 32A, to the delay circuit 41 of the 0-degree DLL block 35, while the selector circuit 32 supplies no signal to the delay circuit 42 via the output terminal 32B. This is because, in the state in which the data latency is equal to 3 and the external clock has the lowest frequency, the access can be performed well by operating the DRAM (from which data is supplied to the output circuit 50) in synchronism with only the 180-degree clock.

As described above, the above-mentioned DLL circuit selects, in accordance with the frequency of the input clock, either the input clock or the clock which has been subjected to the 1/2 frequency dividing process by the 1/2 frequency divider. The selected clock is supplied to the frequency dividers 36 and 38. Hence, it is possible to prevent occurrence of an underflow or overflow even if the frequency of the input clock changes widely.

Figure 33:
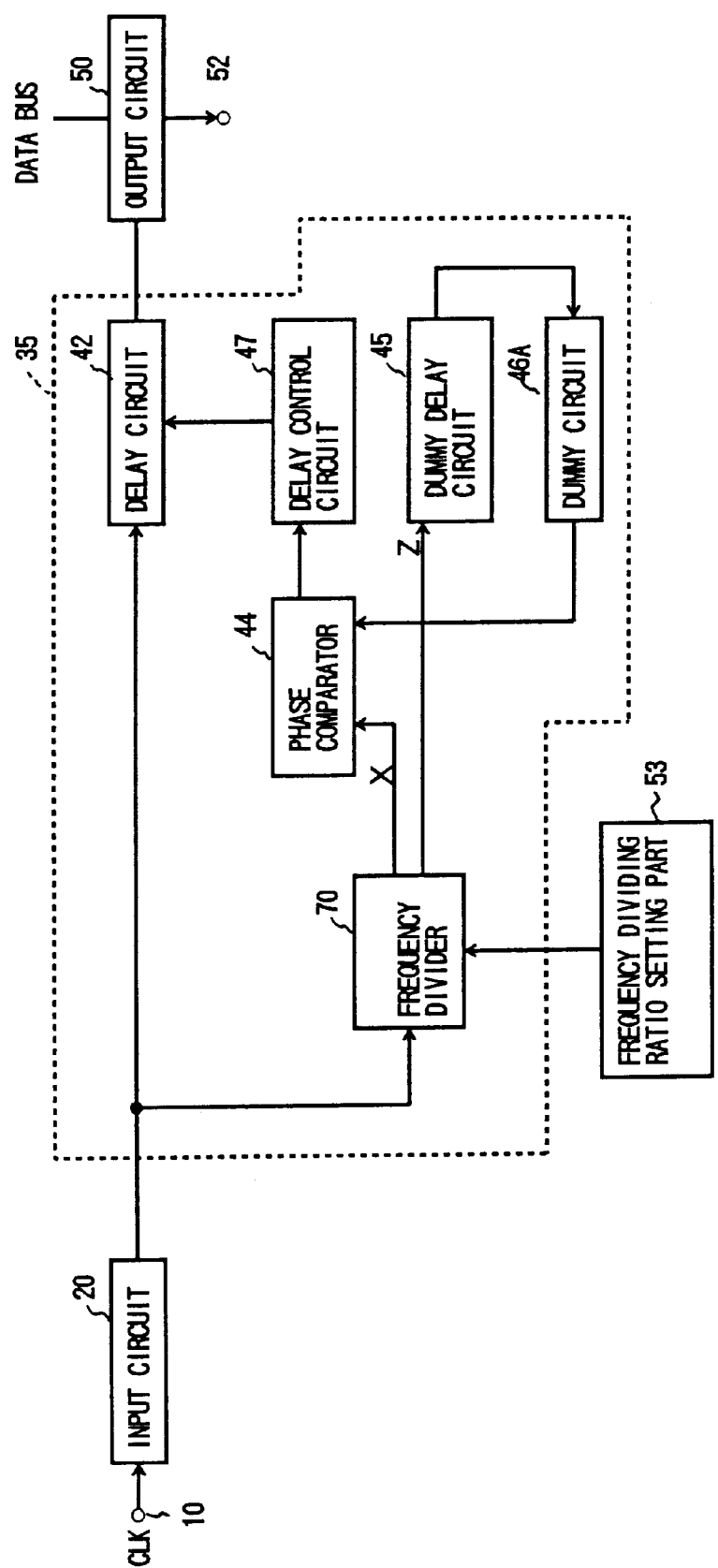
FIG. 33 is a block diagram of a semiconductor integrated circuit device according to a fourth embodiment of the present invention.

FIG. 33 is a block diagram of a semiconductor integrated circuit device according to a fourth embodiment of the present invention. In FIG. 33, parts that are the same as those shown in FIG. 27 are given the same reference numbers. In the fourth embodiment of the present invention, a variable frequency divider is substituted for the frequency dividers 36 and 38 and the selector circuit 40 shown in FIG. 27.

The external clock applied to the clock input pad 10 passes through the input circuit 20 functioning as a buffer, and is applied to the variable frequency divider 70 of the 0-degree DLL block 35.

The variable frequency divider 70 frequency-divides the external clock. In this case, the frequency dividing ratio can be set to 2/4, 3/6 or 4/8 in accordance with the frequency dividing ratio setting signal supplied from the frequency dividing ratio setting part 53. At the frequency dividing ratio of 2/4, the dummy clock Z is at the low level L during the period equal to two cycles of the supplied clock, and is at the high level H during the period equal to two cycles thereof. The reference clock X is the inverted signal of the reference clock Z. At the frequency dividing ratio of 3/6, the dummy clock Z is at the low level L during the period equal to three cycles of the supplied clock, and is at the high level H during the period equal to three cycles thereof. The reference clock X is the inverted signal of the dummy clock Z. At the frequency dividing ratio of 4/8, the dummy clock Z is at the low level L during the period equal to four cycles of the supplied clock, and is at the high level H during the period equal to four cycles. The reference clock X is the inverted signal of the dummy clock Z. The reference clock X is supplied to the phase comparator 44, and the dummy clock Z is supplied to the phase comparator 44 via the dummy delay circuit 45 and the dummy circuit 46A.

The dummy circuit 46A has the same circuit configuration as that of the input circuit 20 and has the same delay amount as that of the input circuit 20. The phase comparator 44 compares the phase of the delayed dummy clock dZ from the dummy circuit 46 with the phase of the reference clock X from the phase comparator 44, and results in a phase difference signal, which is supplied to a delay control circuit 47. The delay control circuit 47 controls, on the basis of the phase difference signal, the delay amount of the dummy delay circuit 45 so that the phase difference becomes zero. Thus, the delay amount of the dummy delay circuit 45 is controlled in the variable fashion so that the rising edge of the dummy clock dZ coincides with the rising edge of the reference clock X, that is, the delayed dummy clock dZ lags behind the reference clock X by a delay of time equal to k cycles of the external clock.

The delay circuit 41 supplied with the inverted frequency-divided clock and the dummy delay circuit 42 supplied with the frequency-divided clock have the same configuration as the dummy delay circuit 45, and are controlled, by the delay control circuit 47, to have the same delay amounts as that of the dummy delay circuit 45. The frequency-divided clock (0-degree clock) delayed by 360 degrees by the delay circuit 42 is supplied, as the real clock, to the output circuit 50, and the frequency-divided clock (180-degree clock) delayed by 180 degrees by the delay circuit 41 is supplied, as the inverted real clock, to the output circuit 50. The output circuit 50 buffers data on the data bus in synchronism with the real clock and the inverted real clock, and outputs buffered data via a data output pad 52. That is, the data output from the output circuit 50 is synchronized with the input clock externally supplied via the clock input pad 10.

Even in the fourth embodiment of the present invention, the delay amount of the reference clock can be varied by changing the frequency dividing ratio of the variable frequency divider 70 in accordance with the frequency of the input clock. Hence, it is possible to prevent occurrence of an underflow by increasing the delay amount of the reference clock and to prevent occurrence of an overflow by reducing the delay amount of the reference clock. In addition, it is possible to reduce the circuit size by the variable frequency divider 70 capable of varying the frequency dividing ratio in accordance with the frequency dividing ratio setting signal, as compared to the arrangement using a plurality of frequency dividers and the selector circuit.

Figure 34:
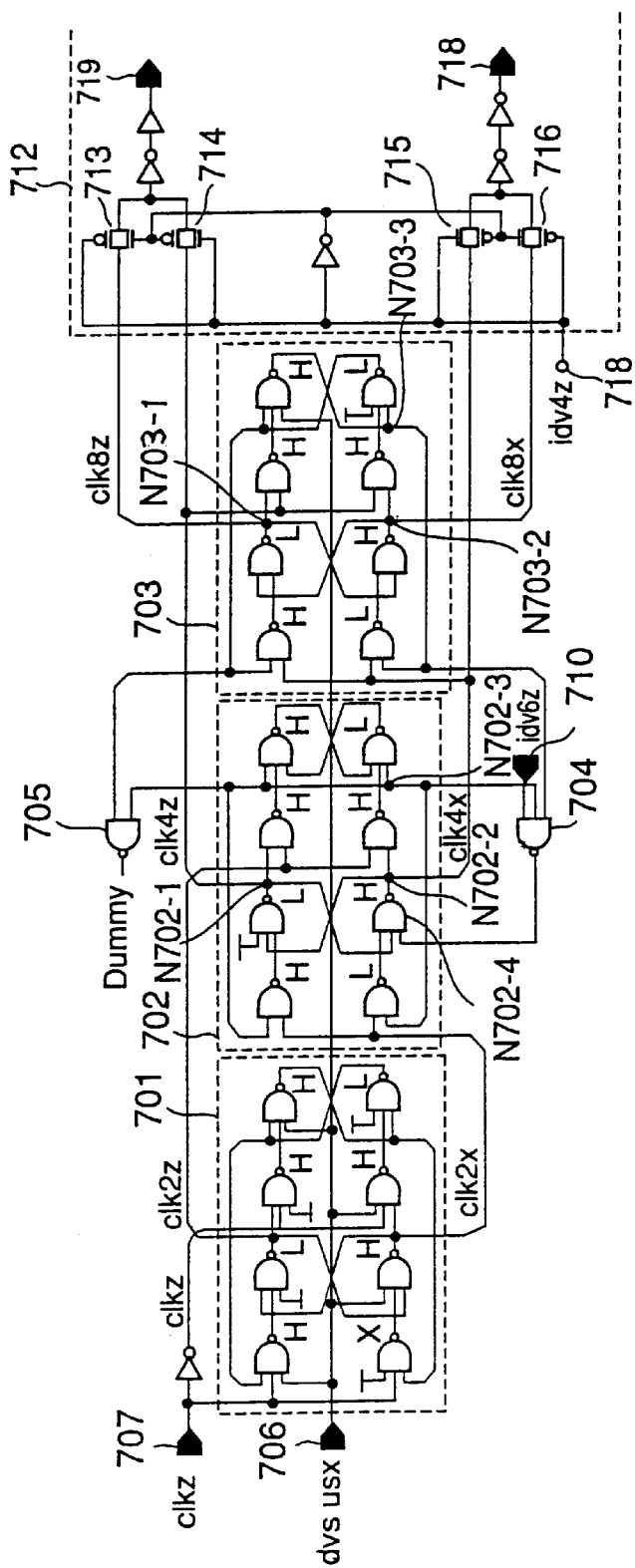
FIG. 34 is a circuit diagram of a variable frequency divider shown in FIG. 33.

FIG. 34 is a circuit diagram of a configuration of the variable frequency divider 70 shown in FIG. 33. The variable frequency divider 70 includes 1/2 frequency dividers 701, 702 and 703, which are cascaded, and a reset loop made up of a NAND gate 704 and a dummy NAND gate 705. Each of the 1/2 frequency dividers 701, 702 and 703 differs from that shown in FIG. 4 in which three-input NAND gates are employed in order to define a preset output value.

When a preset signal applied to a terminal 706 is at the low level, the output levels of the NAND gates of the 1/2 frequency dividers 701, 702 and 703 are shown in FIG. 34 with symbols H, L and X (don't care). After the preset signal becomes H, the variable frequency divider 70 starts the frequency dividing operation on an incoming clock clkz applied via a terminal 707.

The NAND gate 704 performs a NAND operation on the output signal of a node N702-3 of the 1/2 frequency divider 702 and the output signal of a node 703-3 of the 1/2 frequency divider 703. When a frequency dividing ratio setting signal tdv6z supplied via a terminal 710 is at the high level H, the output signal of the NAND gate 704 is looped back to a NAND gate 702-4 of the 1/2 frequency divider 702. Thus, the 1/2 frequency divider 702 is reset every seven cycles of the clock clkz, so that the 3/6 frequency dividing operation on the clock clkz can be realized.

Figure 35:
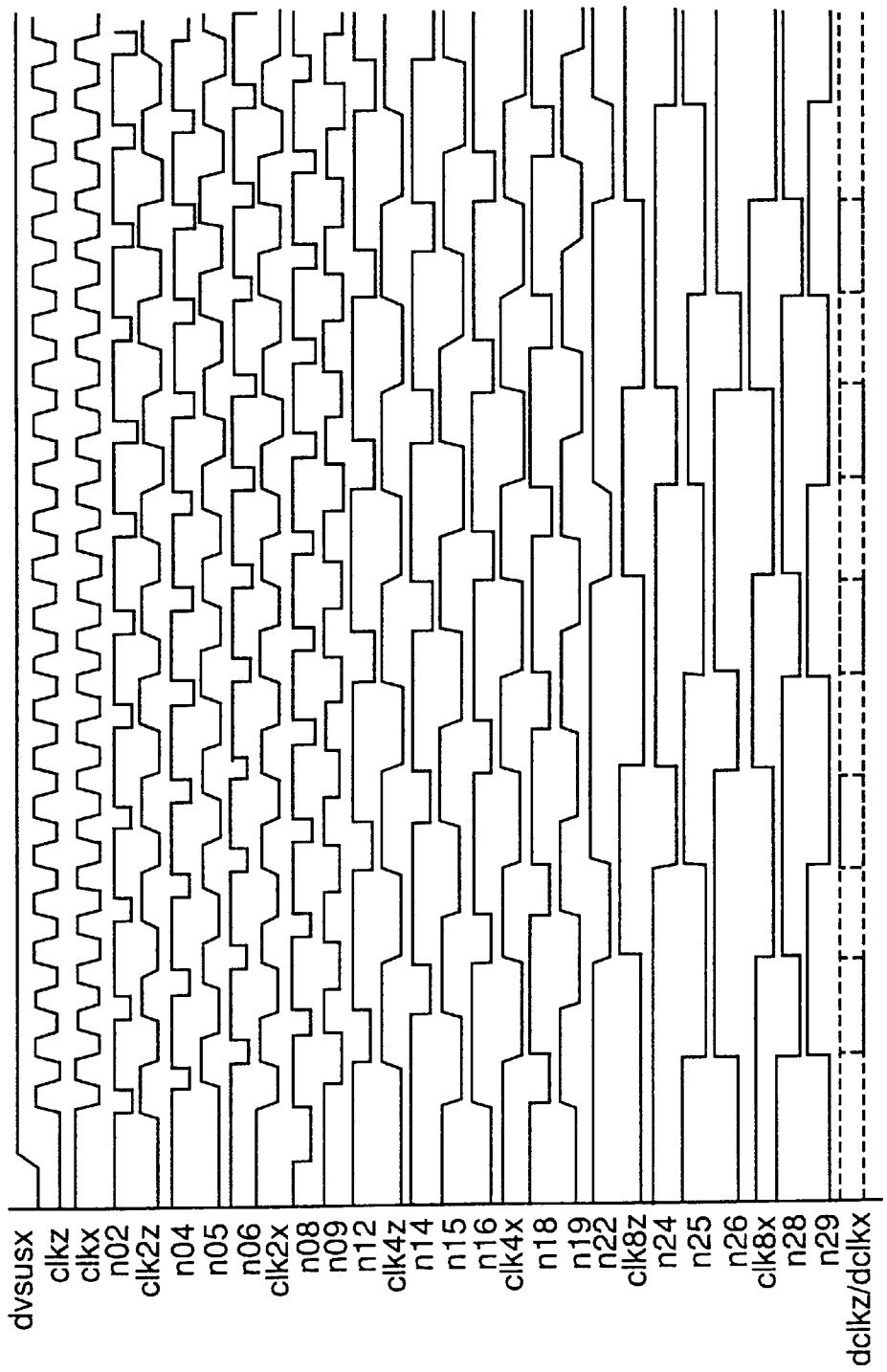
FIG. 35 is a timing chart of an operation of the variable frequency divider shown in FIG. 34.

The 1/2 frequency divider 701 frequency-divides the clock clkz at the frequency dividing ratio of 1/2, and results in clocks clk2z and clk2x. The 1/2 frequency divider 702 frequency-divides the clocks clk2z and clk2x at the frequency dividing ratio of 1/2, and results in clocks clk4z and clk4x having a frequency dividing ratio of 2/4. The clocks clk4z and clk4x are supplied to transmission gates 714 and 715 forming a selector 712. When the frequency dividing ratio setting signal tdv6z is at the low level, the 1/2 frequency divider 703 frequency-divides the clocks clk4z and clk4z at a frequency dividing ratio of 1/2, and results in 4/8-frequency divided clocks clk8z and clk8x which are available at nodes N703-1 and N703-2. Then, the clocks clk8z and clk8x are supplied to transmission gates 713 and 716 forming the selector 712. FIG. 35 is a timing chart of an operation of the variable frequency divider 70 performed when the frequency dividing ratio setting signal tdv6z is at the low level L.

Figure 36:
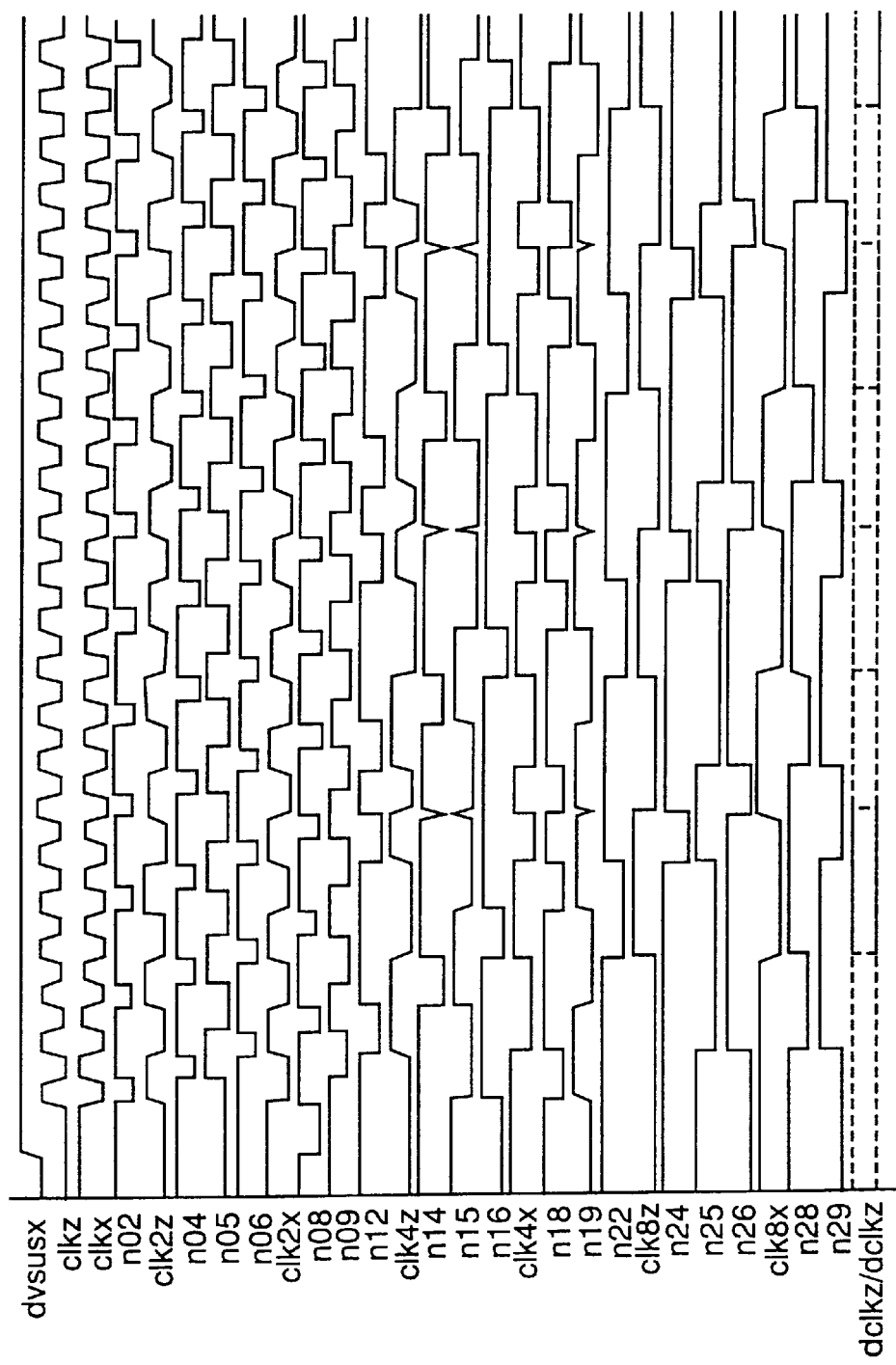
FIG. 36 is a timing chart of another operation of the variable frequency divider shown in FIG. 34.

On the other hand, when the frequency dividing ratio setting signal tdv6z is at the high level H, the 1/2 frequency divider 702 is reset every seven cycles of the clock clkz by the NAND gate 704. Thus, the clocks clk8z and clk8x are clocks obtained by frequency-dividing the clock clkz at a frequency dividing ratio of 3/6. FIG. 36 is a timing chart of an operation of the variable frequency divider 70 performed when the frequency dividing ratio setting signal tdv6z is at the high level H.

The selector 712 is supplied with a frequency dividing ratio setting signal tdv4z from a terminal 718. When the frequency dividing ratio setting signal tdv4z is at the high level H, the transmission gates 714 and 715 are selected, and the clocks clk4z and clk4x are output via terminals 719 and 720, respectively. When the frequency dividing ratio setting signal tdv4z is at the low level L, the transmission gates 713 and 716 are selected and the clocks clk8z and clk8x (3/6-frequency-divided clock or 4/8-frequency-divided clock) are output via the terminals 719 and 720. The output clock available at the terminal 719 is used as the dummy clock Z, and the output clock available at the terminal 720 is used as the reference clock X.

Figure 37:
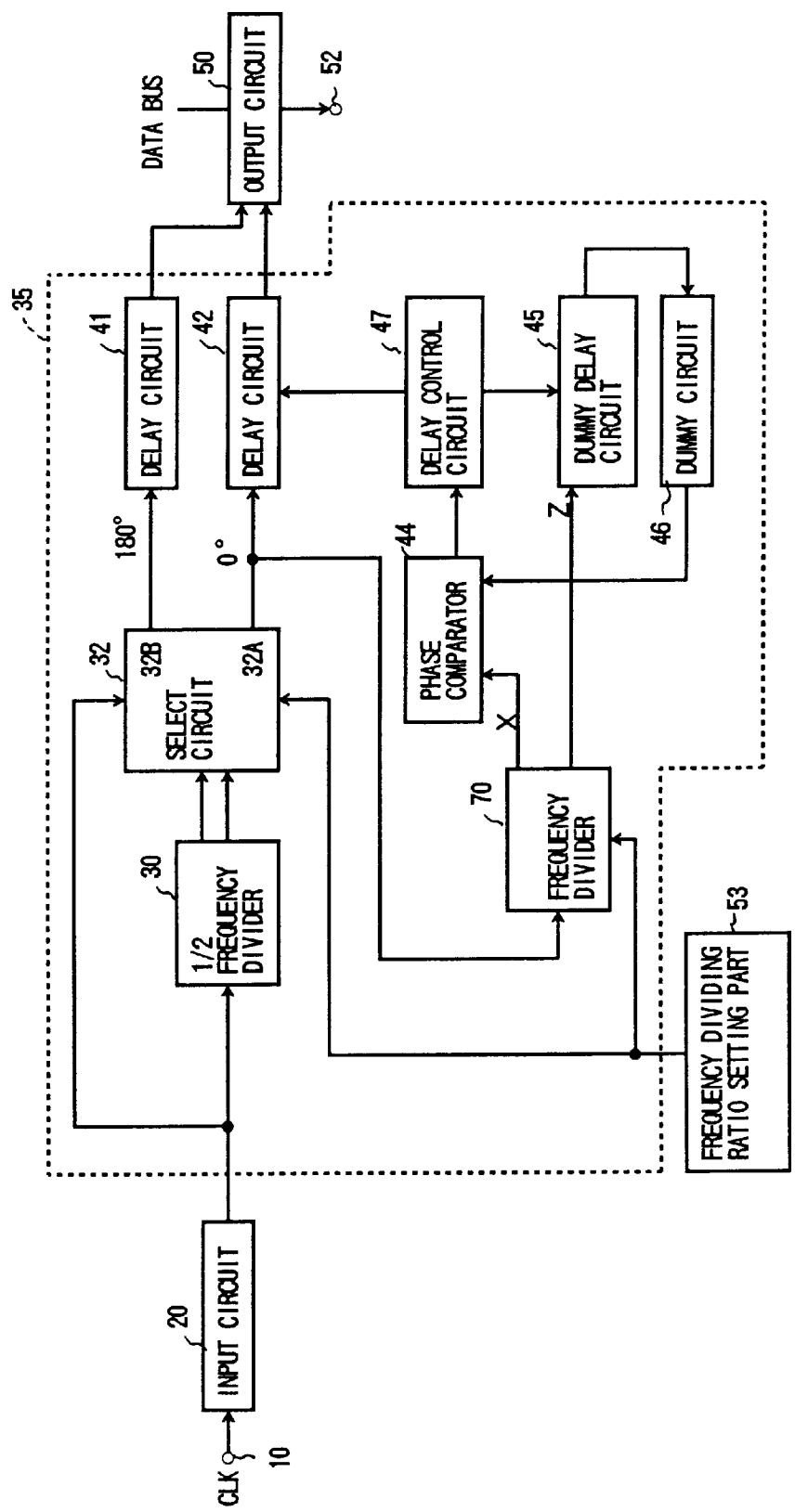
FIG. 37 is a block diagram of a semiconductor integrated circuit device according to a fifth embodiment of the present invention.

FIG. 37 is a block diagram of a semiconductor integrated circuit device according to a fifth embodiment of the present invention. In FIG. 37, parts that are the same as those shown in FIGS. 2 and 33 are given the same reference numbers. In the configuration shown in FIG. 37, the variable frequency divider 70 is substituted for the frequency dividers 36 and 38 and the selector circuit 40, and the frequency dividing ratio setting part 53 is substituted for the mode register 34.

The external clock CLK applied to the clock input pad 10 passes through the input circuit 20 functioning as a buffer, and is supplied to the 1/2 frequency divider 30 and the selector circuit 32. The 1/2 frequency divider 30 frequency-divides the external clock at the frequency dividing ratio of 1/2, and results in the frequency-divided signal (0 degree) and the inverted frequency-divided signal (180 degrees). These frequency-divided signals are supplied to the selector circuit 32.

The selector circuit 32 is configured as shown in FIG. 3. That is, the selector circuit 32 includes the transfer gates 55, 56 and 57, and the inverter 58.

The frequency dividing ratio setting signal used in the above case switches to H when the frequency of the external clock is low and a low frequency dividing ratio should be instructed. When the frequency dividing ratio setting signal is H, the transfer gate 55 is ON and the transfer gates 56 and 57 are OFF. The external clock via the transfer gate 55 from the input circuit 20 is output via the terminal 32A of the selector circuit 32, and is supplied to the 0-degree DLL block 35. At that time, no signal is output via the terminal 32B.

When the frequency dividing ratio setting signal is L, the transfer gates 56 and 57 are ON and the transfer gate 55 is OFF. Thus, the frequency-divided clock and the inverted frequency-divided clock passing through the transfer gates 56 and 57 are output via the terminals 32A and 32B of the selector circuit 32, and are supplied to the 0-degree DLL block 35.

The signal output via the terminal 32A is supplied to the frequency divider 36 and the delay circuit 42 of the 0-degree DLL block 35. The signal output via the terminal 32B (which is the inverted frequency-divided signal when DL=L, and no signal is output when DL=H) is supplied to the delay circuit 41.

The variable frequency divider 70 frequency-divides the external clock. In this case, the frequency dividing ratio can be set to 2/4, 3/6 or 4/8 in accordance with the frequency dividing ratio setting signal supplied from the frequency dividing ratio setting part 53. At the frequency dividing ratio of 2/4, the dummy clock Z is at the low level L during the period equal to two cycles of the supplied clock, and is at the high level H during the period equal to two cycles thereof. The reference clock X is the inverted signal of the reference clock Z. At the frequency dividing ratio of 3/6, the dummy clock Z is at the low level L during the period equal to three cycles of the supplied clock, and is at the high level H during the period equal to three cycles thereof. The reference clock X is the inverted signal of the dummy clock Z. At the frequency dividing ratio of 4/8, the dummy clock Z is at the low level L during the period equal to four cycles of the supplied clock, and is at the high level H during the period equal to four cycles. The reference clock X is the inverted signal of the dummy clock Z. The reference clock X is supplied to the phase comparator 44, and the dummy clock Z is supplied to the phase comparator 44 via the dummy delay circuit 45 and the dummy circuit 46.

The dummy circuit 46 has the same circuit configurations as those of the input circuit 20, the 1/2 frequency divider 30 and the output circuit 50, and has the same delay amounts as those thereof. The phase comparator 44 compares the phase of the delayed dummy clock dZ from the dummy circuit 46 with the phase of the reference clock X from the phase comparator 44, and results in the phase difference signal, which is supplied to a delay control circuit 47. The delay control circuit 47 controls, on the basis of the phase difference signal, the delay amount of the dummy delay circuit 45 so that the phase difference becomes zero. Thus, the delay amount of the dummy delay circuit 45 is controlled in the variable fashion so that the rising edge of the dummy clock dZ coincides with the rising edge of the reference clock X, that is, the delayed dummy clock dZ lags behind the reference clock X by a delay of time equal to k cycles of the external clock.

The delay circuit 41 supplied with the inverted frequency-divided clock and the dummy delay circuit 42 supplied with the frequency-divided clock have the same configuration as the dummy delay circuit 45, and are controlled, by the delay control circuit 47, to have the same delay amounts as that of the dummy delay circuit 45. The frequency-divided clock (0-degree clock) delayed by 360 degrees by the delay circuit 42 is supplied, as the real clock, to the output circuit 50, and the frequency-divided clock (180-degree clock) delayed by 180 degrees by the delay circuit 41 is supplied, as the inverted real clock, to the output circuit 50. The output circuit 50 buffers data on the data bus in synchronism with the real clock and the inverted real clock, and outputs buffered data via a data output pad 52. That is, the data output from the output circuit 50 is synchronized with the input clock externally supplied via the clock input pad 10.

The selector circuit 32 selects the external clock which has not been subjected to the 1/2 frequency dividing process and outputs it, via the terminal 32A, to the delay circuit 41 of the 0-degree DLL block 35, while the selector circuit 32 supplies no signal to the delay circuit 42 via the output terminal 32B. This is because, in the state in which the data latency is equal to 3 and the external clock has the lowest frequency, the access can be performed well by operating the DRAM (from which data is supplied to the output circuit 50) in synchronism with only the 180-degree clock.

The selector circuit 32 selects the external clock which has not been subjected to the 1/2 frequency dividing process and outputs it, via the terminal 32A, to the delay circuit 41 of the 0-degree DLL block 35, while the selector circuit 32 supplies no signal to the delay circuit 42 via the output terminal 32B. This is because, in the state in which the data latency is equal to 3 and the external clock has the lowest frequency, the access can be performed well by operating the DRAM (from which data is supplied to the output circuit 50) in synchronism with only the 180-degree clock.

As described above, the above-mentioned DLL circuit selects, in accordance with the frequency of the input clock, either the input clock or the clock which has been subjected to the 1/2 frequency dividing process by the 1/2 frequency divider. The selected clock is supplied to the frequency dividers 36 and 38. Hence, it is possible to prevent occurrence of an underflow or overflow even if the frequency of the input clock changes widely.

The present invention is not limited to the specifically described embodiments, and variations and modifications thereof will be made. For example, the logic elements forming the delay circuit are not limited to the NAND gates and inverters, but may be of another type of logic gates such as NOR gates and EOR gates.

The present invention is not specifically limited to the SDRAM but includes any semiconductor integrated circuit device from which an output signal is output in synchronism with the input signal applied from the outside of the device.

What is claimed is:

1. A semiconductor integrated circuit device comprising:
   a delayed locked loop circuit including:
   a frequency divider which frequency-divides an input clock at a frequency dividing ratio which is varied depending on a frequency of the input clock and thus results in a dummy clock and a reference clock;
   a delay system including a variable delay circuit which delays the dummy clock; and
   a control circuit which controls a delay amount of the variable delay circuit so that a phase of a delayed dummy clock from the delay system and the reference clock becomes zero.

2. The semiconductor integrated circuit device as claimed in claim 1, wherein the frequency dividing ratio of the frequency divider is increased when the frequency of the input clock becomes higher.

3. The semiconductor integrated circuit device as claimed in claim 2, wherein the frequency dividing ratio of the frequency divider is indicated by a frequency dividing ratio setting signal applied to the delayed locked loop circuit.

4. The semiconductor integrated circuit device as claimed in claim 1, wherein the frequency divider comprises:
   a plurality of frequency dividing parts respectively having different frequency dividing ratios; and
   a selector circuit which selects one of the plurality of frequency dividing parts in accordance with a frequency dividing ratio setting signal applied to the delayed locked loop circuit.

5. The semiconductor integrated circuit device as claimed in claim 4, wherein only said one of the plurality of frequency dividing parts selected by the selector circuit is enabled.

6. The semiconductor integrated circuit device as claimed in claim 1, wherein said frequency divider is a variable frequency divider.

7. The semiconductor integrated circuit device as claimed in claim 1, further comprising a frequency dividing ratio setting signal generating circuit which detects the frequency of the input clock and thus results in a frequency dividing ratio setting signal indicating the frequency dividing ratio of the frequency divider.

8. A semiconductor integrated circuit device comprising:
   a 1/2 frequency divider which frequency-divides an input clock at a frequency dividing ratio of 1/2;
   a selector circuit which selects one of the input clock and a frequency-divided clock from the 1/2 frequency divider in accordance with a frequency of the input clock; and
   a delayed locked loop circuit including:
   a frequency divider which frequency-divides a selected clock from the selector circuit and produces a dummy clock and a reference clock;
   a delay system including a variable delay circuit which delays the dummy clock; and
   a control circuit which controls a delay amount of the variable delay circuit so that a phase of a delayed dummy clock from the delay system and the reference clock becomes zero.

* * * * *